(12) United States Patent
Asnaashari et al.

(10) Patent No.: US 8,095,765 B2
(45) Date of Patent: Jan. 10, 2012

(54) MEMORY BLOCK MANAGEMENT

(75) Inventors: Mehdi Asnaashari, Danville, CA (US);
Alan Chen, Cupertino, CA (US);
Siamack Nemazie, Los Altos Hills, CA (US)

(73) Assignee: Micron Technology, Inc., Boise, ID (US)

( * ) Notice: Subject to any disclaimer, the term of this patent is extended or adjusted under 35 U.S.C. 154(b) by 368 days.

(21) Appl. No.: 12/397,396

(22) Filed: Mar. 4, 2009

(65) Prior Publication Data
US 2010/0228940 A1 Sep. 9, 2010

(51) Int. Cl.
*G06F 12/00* (2006.01)
(52) U.S. Cl. ........ 711/170; 711/103; 711/159; 711/202; 714/25; 714/45
(58) Field of Classification Search .................. None
See application file for complete search history.

(56) References Cited

U.S. PATENT DOCUMENTS

| | | | |
|---|---|---|---|
| 6,134,151 | A | 10/2000 | Estakhri et al. |
| 6,141,249 | A | 10/2000 | Estakhri et al. |
| 6,262,918 | B1 | 7/2001 | Estakhri et al. |
| 6,327,639 | B1 | 12/2001 | Asnaashari |
| 7,424,587 | B2 | 9/2008 | Caulkins et al. |
| 2004/0268084 | A1 * | 12/2004 | Longerbeam et al. ........ 711/206 |
| 2008/0052446 | A1 * | 2/2008 | Lasser et al. .................. 711/103 |
| 2008/0155175 | A1 | 6/2008 | Sinclair et al. |

FOREIGN PATENT DOCUMENTS

WO 2005066974 A1 7/2005
WO WO 2005066974 A1 * 7/2005

OTHER PUBLICATIONS

International Search Report and Written Opinion for related PCT Application PCT/US2010/000540, mailed Sep. 30, 2010 (9 pgs.).

* cited by examiner

*Primary Examiner* — Shawn X Gu
(74) *Attorney, Agent, or Firm* — Brooks, Cameron & Huebsch, PLLC

(57) ABSTRACT

Various embodiments include one or more memory devices having at least two planes of physical blocks organized into super blocks, with each super block including a physical block from each of the at least two planes. Embodiments include determining defective blocks within the planes. If none of the blocks at a particular block position are determined to be defective, embodiments include assigning the blocks at the particular block position to a super block, and if one or more of the blocks at a particular block position are determined to be defective, embodiments include: assigning the blocks at the particular block position determined to be defective to a super block; and assigning a respective replacement block to the super block for each of the one or more blocks at the particular block position determined to be defective. The respective replacement block is selected from a number of blocks within a respective one of the planes that includes the respective block determined to be defective.

30 Claims, 9 Drawing Sheets

MEMORY BLOCK MANAGEMENT

TECHNICAL FIELD

The present disclosure relates generally to semiconductor memory devices, methods, and systems, and more particularly, to memory block management.

BACKGROUND

Memory devices are typically provided as internal, semiconductor, integrated circuits in computers or other electronic devices. There are many different types of memory including volatile and non-volatile memory. Volatile memory can require power to maintain its data and includes random-access memory (RAM), dynamic random access memory (DRAM), and synchronous dynamic random access memory (SDRAM), among others. Non-volatile memory can provide persistent data by retaining stored information when not powered and can include NAND flash memory, NOR flash memory, read only memory (ROM), Electrically Erasable Programmable ROM (EEPROM), Erasable Programmable ROM (EPROM), and phase change random access memory (PCRAM), among others.

Memory devices can be combined together to form a solid state drive (SSD). A solid state drive can include non-volatile memory, e.g., NAND flash memory and NOR flash memory, and/or can include volatile memory, e.g., DRAM and SRAM, among various other types of non-volatile and volatile memory.

An SSD can be used to replace hard disk drives as the main storage device for a computer, as the solid state drive can have advantages over hard drives in terms of performance, size, weight, ruggedness, operating temperature range, and power consumption. For example, SSDs can have superior performance when compared to magnetic disk drives due to their lack of moving parts, which may avoid seek time, latency, and other electro-mechanical delays associated with magnetic disk drives. SSD manufacturers can use non-volatile flash memory to create flash SSDs that may not use an internal battery supply, thus allowing the drive to be more versatile and compact.

An SSD can include a number of memory devices, e.g., a number of memory chips (as used herein, "a number of" something can refer to one or more of such things, e.g., a number of memory devices can refer to one or more memory devices. As one of ordinary skill in the art will appreciate, a memory chip can include a number of dies. Each die can include a number of memory arrays and peripheral circuitry thereon. A memory array can include a number of planes, with each plane including a number of physical blocks of memory cells. Each physical block can include a number of pages of memory cells that can store a number of sectors of data.

Memory block selection within an SSD can involve determining which physical blocks to program (e.g., write data to) and which physical blocks to erase, as well as the order in which the physical blocks are to be written to and erased, for example. The memory cells used in SSDs can be limited to a finite number of write-erase cycles, which can determine the lifetime of the drive. As such, improving memory block selection efficiency and allocation efficiency can increase the life of an SSD.

DETAILED DESCRIPTION

Figure 1:
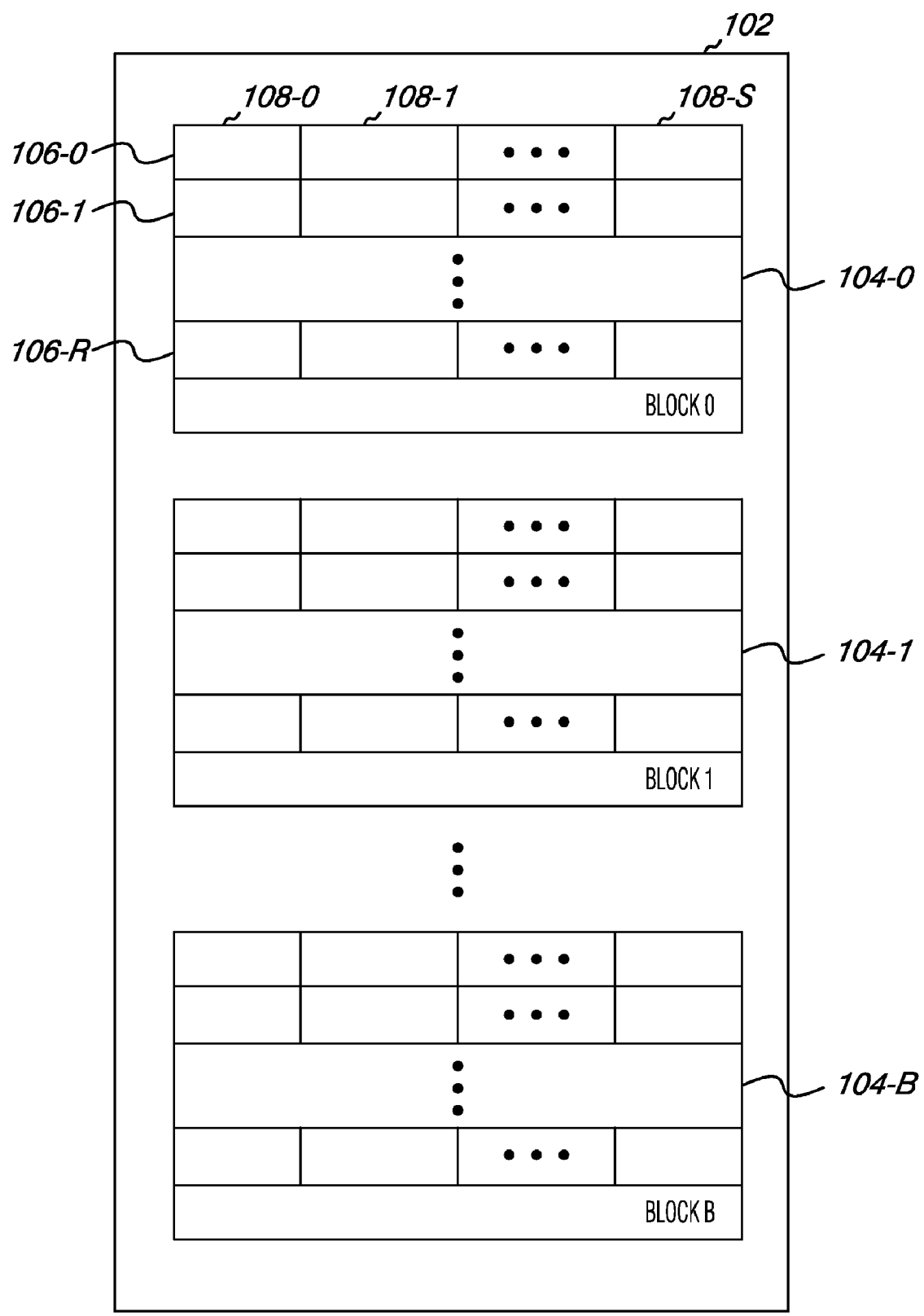
FIG. 1 is a diagram of a memory array that includes multiple blocks and can be operated in accordance with one or more embodiments of the present disclosure.

The present disclosure includes methods and devices for memory block management in a memory system. One or more embodiments of the present disclosure include one or more memory devices having at least two planes of physical blocks organized into super blocks, with each super block including a physical block from each of the at least two planes. One or more embodiments include determining defective physical blocks within the planes. If none of the physical blocks at a particular block position are determined to be defective, one or more embodiments include assigning the physical blocks at the particular block position to a super block, and if one or more of the physical blocks at a particular block position are determined to be defective, one or more embodiments include: assigning the physical blocks at the particular block position that were not determined to be defective to a super block; and assigning a respective replacement physical block to the super block for each of the one or more physical blocks at the particular block position that were determined to be defective. In one or more embodiments, the respective replacement physical block is selected from a number of physical blocks within a respective one of the planes that includes the respective physical block that was determined to be defective.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, the designators "B," "D," "K," "M," "N," "P," "R," "S," and "T," particularly with respect to reference numerals in the drawings, indicates that a number of the particular feature so designated can be included with one or more embodiments of the present disclosure.

The figures herein follow a numbering convention in which the first digit or digits correspond to the drawing figure number and the remaining digits identify an element or component in the drawing. Similar elements or components between different figures may be identified by the use of similar digits. For example, 110 may reference element "10" in FIG. 1, and a similar element may be referenced as 210 in FIG. 2. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate the embodiments of the present disclosure, and should not be taken in a limiting sense.

FIG. 1 is a diagram of a memory array 102 that includes multiple physical blocks 104-0 (BLOCK 0), 104-1 (BLOCK 1), . . . , 104-B (BLOCK B) and can be operated in accordance with one or more embodiments of the present disclosure. Although not shown in FIG. 1, one of ordinary skill in the art will appreciate that the memory array 102 can be located on a particular semiconductor die along with various peripheral circuitry associated with the operation thereof.

In the example shown in FIG. 1, the indicator "B" is used to indicate that the array 102 can include a number of physical blocks. As an example, the number of physical blocks in array 102 may be 128 blocks, 512 blocks, or 1,024 blocks, but embodiments are not limited to a particular multiple of 128 or to any particular number of physical blocks in an array 102. Further, embodiments are not limited to the type of memory used in the array, e.g., non-volatile, volatile, etc. In the embodiment illustrated in FIG. 1, the memory array 102 can be, for example, a NAND flash memory array 102.

In this example, each physical block 104-0, 104-1, . . . , 104-B includes memory cells which can be erased together as a unit, e.g., the cells in each physical block can be erased in a substantially simultaneous manner. For instance, the cells in each physical block can be erased together in a single operation. Each physical block, e.g., 104-0, 104-1, . . . , 104-B, contains a number of physical rows, e.g., 106-0, 106-1, . . . , 106-R, of memory cells coupled to an access line, e.g., a word line. The indicator "R" is used to indicate that a physical block, e.g., 104-0, 104-1, . . . , 104-B, can include a number of rows. In some embodiments, the number of rows, e.g., word lines, in each physical block can be 32, but embodiments are not limited to a particular number of rows 106-0, 106-1, . . . , 106-R per physical block.

As one of ordinary skill in the art will appreciate, each row 106-0, 106-1, . . . , 106-R can store one or more pages of data. A page refers to a unit of programming and/or reading, e.g., a number of cells that are programmed and/or read together or as a functional group of memory cells. In the embodiment shown in FIG. 1, each row 106-0, 106-1, . . . , 106-R stores one page of data. However, embodiments of the present disclosure are not so limited. For instance, in some embodiments of the present disclosure, each row can store multiple pages of data.

In one or more embodiments of the present disclosure, and as shown in FIG. 1, a page associated with the rows 106-0, 106-1, . . . , 106-R can store data in accordance with a number of physical sectors 108-0, 108-1, . . . , 108-S of data. The indicator "S" is used to indicate that a row, e.g., 106-0, 106-1, . . . , 106-R, can include a number of physical sectors. Each physical sector 108-0, 108-1, . . . , 108-S can correspond to a logical sector and can include overhead information, such as error correction code (ECC) information, and logical block address (LBA) information, as well as user data. As one of ordinary skill in the art will appreciate, logical block addressing is a scheme often used by a host for identifying a logical sector of information. As an example, a logical sector can store information representing a number of bytes of data, e.g., 256 bytes, 512 bytes, or 1,024 bytes. Embodiments are not limited to these examples.

It is noted that other formats and/or configurations for the physical blocks 104-0, 104-1, . . . , 104-B, rows 106-0, 106-1, . . . , 106-R, sectors 108-0, 108-1, . . . , 108-S, and pages are possible. For example, the rows 106-0, 106-1, . . . , 106-R of the physical blocks 104-0, 104-1, . . . , 104-B can include a single logical sector which can include, for example, more or less than 512 bytes of data.

Figure 2:
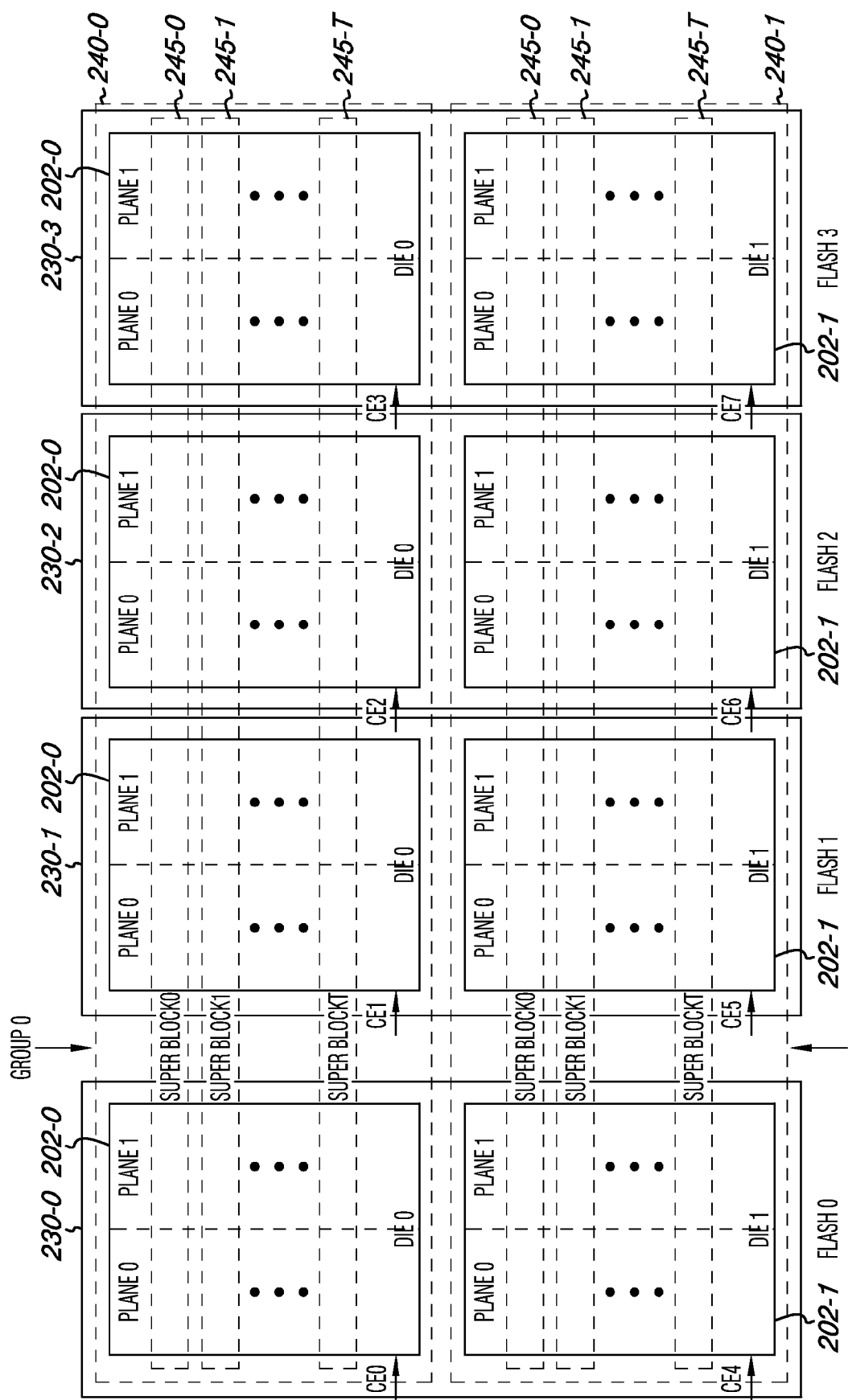
FIG. 2 is a diagram illustrating a number of memory devices having multiple Groups of planes that can be operated in accordance with one or more embodiments of the present disclosure.

FIG. 2 is a diagram illustrating a number of memory devices having multiple Groups of planes that can be operated in accordance with one or more embodiments of the present disclosure. According to one or more embodiments described herein, planes of physical blocks of memory cells are organized into Groups for purposes of memory block management. In one or more embodiments, a Group can include a number of planes from one or more different memory arrays. In one or more embodiments, the one or more planes corresponding to a Group can be from different memory devices.

The embodiment shown in FIG. 2 includes four memory devices 230-0, 230-1, 230-2, and 230-3. The combination of memory devices 230-0, 230-1, 230-2, and 230-3 can be referred to as a memory unit, such as memory unit 925 described further herein in connection with FIG. 9. In one or more embodiments, the memory devices 230-0, 230-1, 230-2, and 230-3 form a memory unit of a solid state drive (SSD).

The memory devices 230-0, 230-1, 230-2, and 230-3 can each be a semiconductor memory chip including multiple dies per chip. One of ordinary skill in the art will appreciate that each die on a particular chip can include a memory array along with various peripheral circuitry (not shown in FIG. 2) associated with the operation thereof.

In the embodiment illustrated in FIG. 2, each memory device 230-0, 230-1, 230-2, and 230-3 includes two memory arrays 202-0 and 202-1 (shown as DIE 0 and DIE 1, respectively). Each memory array 202-0 and 202-1 can be a flash memory array such as array 102 described in connection with FIG. 1. For instance, each memory array 202-0 and 202-1 includes multiple physical blocks of memory cells such as blocks 104-0, 104-2, . . . , 104-B shown in FIG. 1.

As one of ordinary skill in the art will appreciate, the physical blocks of an array, e.g., 202-0 and 202-1, can be organized into multiple planes. For instance, in the embodiment illustrated in FIG. 2, each of the memory arrays is divided into a first plane (PLANE 0) of physical blocks and a second plane (PLANE 1) of physical blocks. However, embodiments of the present disclosure are not limited to a particular number of planes per array. For instance, a memory array may include only one plane or may include more than two planes, in various embodiments.

In one or more embodiments, and as described further in connection with FIGS. 3-9, the physical blocks within the arrays, e.g., 202-0 and 202-1, have associated block positions within the planes. The associated positions can indicate a block's physical location within its particular plane. In one or more embodiments, the physical blocks from a common plane cannot be erased simultaneously, but physical blocks from different planes can be erased simultaneously.

In the embodiment illustrated in FIG. 2, the planes of physical blocks associated with the memory devices 230-0, 230-1, 230-2, and 230-3 are organized into two Groups, e.g., 240-0 (GROUP 0) and 240-1 (GROUP 1). In the embodiment illustrated in FIG. 2, each Group 240-0 and 240-1 includes each of the planes from each of four memory arrays. For instance, Group 240-0 includes the planes (PLANE 0 and PLANE 1) of array 202-0 (DIE 0) within each of the four memory devices 230-0, 230-1, 230-2, and 230-3. Group 240-1 includes the planes (PLANE 0 and PLANE 1) of array 202-1 (DIE 1) within each of the four memory devices 230-0, 230-1, 230-2, and 230-3.

Embodiments are not limited to the example shown in FIG. 2. For instance, in one or more embodiments, a Group can include a collection of planes within a single array. As an example, one Group can include PLANE 0 and PLANE 1 of array 202-0 of device 230-0, another Group can include PLANE 0 and PLANE 1 of array 202-1 of device 230-0, and another Group can include PLANE 0 and PLANE 1 of array 202-0 of device 230-1.

In some embodiments, a Group can include a number of planes within different arrays of a single memory device. As an example, one Group can include PLANE 0 of array 202-0 and PLANE 0 of array 202-1 of device 230-0, and another Group can include PLANE 1 of array 202-0 and PLANE 1 of array 202-1 of device 230-0. As another example, one Group can include PLANE 0 and PLANE 1 of array 202-0 and PLANE 0 and PLANE 1 of array 202-1 of device 230-0, and another Group can include PLANE 0 and PLANE 1 of array 202-0 and PLANE 0 and PLANE 1 of array 202-1 of device 230-1.

In embodiments in which the arrays, e.g., 202-0 and 202-1, include multiple planes, a Group of planes may, in some embodiments, include one plane from each of one or more arrays of different memory devices. For example, in reference to FIG. 2, in one or more embodiments, each of a number of Groups can include a collection of one plane from each of four memory arrays within the four respective memory devices. For instance, one Group can include PLANE 0 of array 202-0 (DIE 0) within each of the four memory devices 230-0, 230-1, 230-2, and 230-3. A second Group can include PLANE 1 of array 202-0 (DIE 0) within each of the four memory devices 230-0, 230-1, 230-2, and 230-3. A third Group can include PLANE 0 of array 202-1 (DIE 1) within each of the four memory devices 230-0, 230-1, 230-2, and 230-3, and a fourth Group can include PLANE 1 of array 202-1 (DIE 1) within each of the four memory devices 230-0, 230-1, 230-2, and 230-3.

In one or more embodiments, and as illustrated in FIG. 2, the Groups 240-0 and 240-1 each have a number of Super Blocks associated therewith, e.g., SUPER BLOCK 0, SUPER BLOCK 1, . . . , SUPER BLOCK N. As used herein, a Super Block can refer to a collection of physical blocks that includes a physical block from each plane within a corresponding Group. In various embodiments, a Super Block includes no more than one physical block from each plane in its Group (e.g., no more than one physical block from a common plane). In one or more embodiments, a Super Block can span across multiple memory devices. For example, a Super Block can be a collection of physical blocks that includes a physical block from a plane within each of at least two memory arrays within different memory devices within a corresponding Group.

Embodiments are not limited to a particular number of Super Blocks per Group. As an example, a Group, e.g., 240-0 and 240-1, can include 64, 512, or 1,024 Super Blocks per Group. In the embodiment illustrated in FIG. 2, the Super Blocks 245-0, 245-1, . . . , 245-N associated with Group 240-0 are each a respective collection of physical blocks including a number of physical blocks from each of the four arrays 202-0, e.g., DIE 0 associated with the four respective memory devices 230-0, 230-1, 230-2, and 230-3. Also, the Super Blocks 245-0, 245-1, . . . , 245-N associated with Group 240-1 are each a respective collection of physical blocks including a number of physical blocks from each of the four arrays 202-1, e.g., DIE 1 associated with the four respective memory devices 230-0, 230-1, 230-2, and 230-3.

In one or more embodiments of the present disclosure, a Super Block can be a collection of one physical block per plane for each of a number of planes corresponding to a particular Group. For instance, in the embodiment illustrated in FIG. 2, each of the Super Blocks 245-0, 245-1, . . . , 245-N can be a respective collection of eight physical blocks (one block per plane for each array 202-0 of the four different memory devices 230-0, 230-1, 230-2, and 230-3 of the Group).

However, in one or more embodiments, a Super Block does not have to include a physical block from every plane in a given memory array, e.g., 202-0 and 202-1. For instance, in the embodiment illustrated in FIG. 2, each of the Super Blocks 245-0, 245-1, . . . , 245-N can be a respective collection of four physical blocks, e.g., one block from one of the planes in each array 202-0 of the four different memory devices 230-0, 230-1, 230-2, and 230-3 of the Group or one block from one of the planes in each array 202-1 of the four different memory devices 230-0, 230-1, 230-2, and 230-3.

In various embodiments, an erase operation can be performed concurrently on the physical blocks of a Super Block. That is, the collection of physical blocks of a particular Super Block can be erased substantially simultaneously. Also, in various embodiments, the pages of physical blocks associated with a particular Super Block can be concurrently read from and written to.

Embodiments of the present disclosure are not limited to the example illustrated in FIG. 2. For instance, in one or more embodiments a Group can include planes of physical blocks within more or less than four memory arrays. As an example, the embodiment shown in FIG. 2 could be organized into four Groups: a first Group could include the planes of arrays 202-0 (DIE 0) within memory devices 230-0 and 230-1; a second Group could include the planes of arrays 202-0 (DIE 0) within memory devices 230-2 and 230-3; a third Group could include the planes of arrays 202-1 (DIE 1) within memory devices 230-0 and 230-1; and a fourth Group could include the planes of arrays 202-1 (DIE 1) within memory devices 230-2 and 230-3. In this example, Super Blocks associated with the four Groups could include two physical blocks (one physical block from each of the two arrays associated with the particular Group) or could include four physical blocks (one physical block per plane for each of the two arrays associated with the particular Group). As an example, a Super Block of four physical blocks (one physical block per plane for each of the two arrays associated with the particular Group) can include 128 pages per physical block and 8 physical sectors per page (assuming 4 KB pages), for a total of 4,096 physical sectors per Super Block. In this example, a LBA range of 4,096 addresses can be mapped to a particular 4,096 sector physical Super Block. However, embodiments of the present disclosure are not limited to a particular page size, sector size, and/or physical block size. For instance, embodiments are not limited to a particular number of sectors per Super Block.

In one or more embodiments, the physical blocks within a particular Super Block, e.g., 245-0 to 245-N, can have different block positions. That is, the physical blocks within a particular Super Block can be located at different locations within the planes corresponding to a given Group, e.g., 240-0 and 240-1. As one example, consider the physical blocks corresponding to Super Block 245-0 of Group 240-0. The collection of physical blocks corresponding to Super Block 245-0 can include physical blocks located near a top portion of array 202-0 of device 230-0 and can include physical blocks located near the middle or lower portion of the arrays 202-0 of devices 230-1, 230-2, and 230-3.

Figure 3:
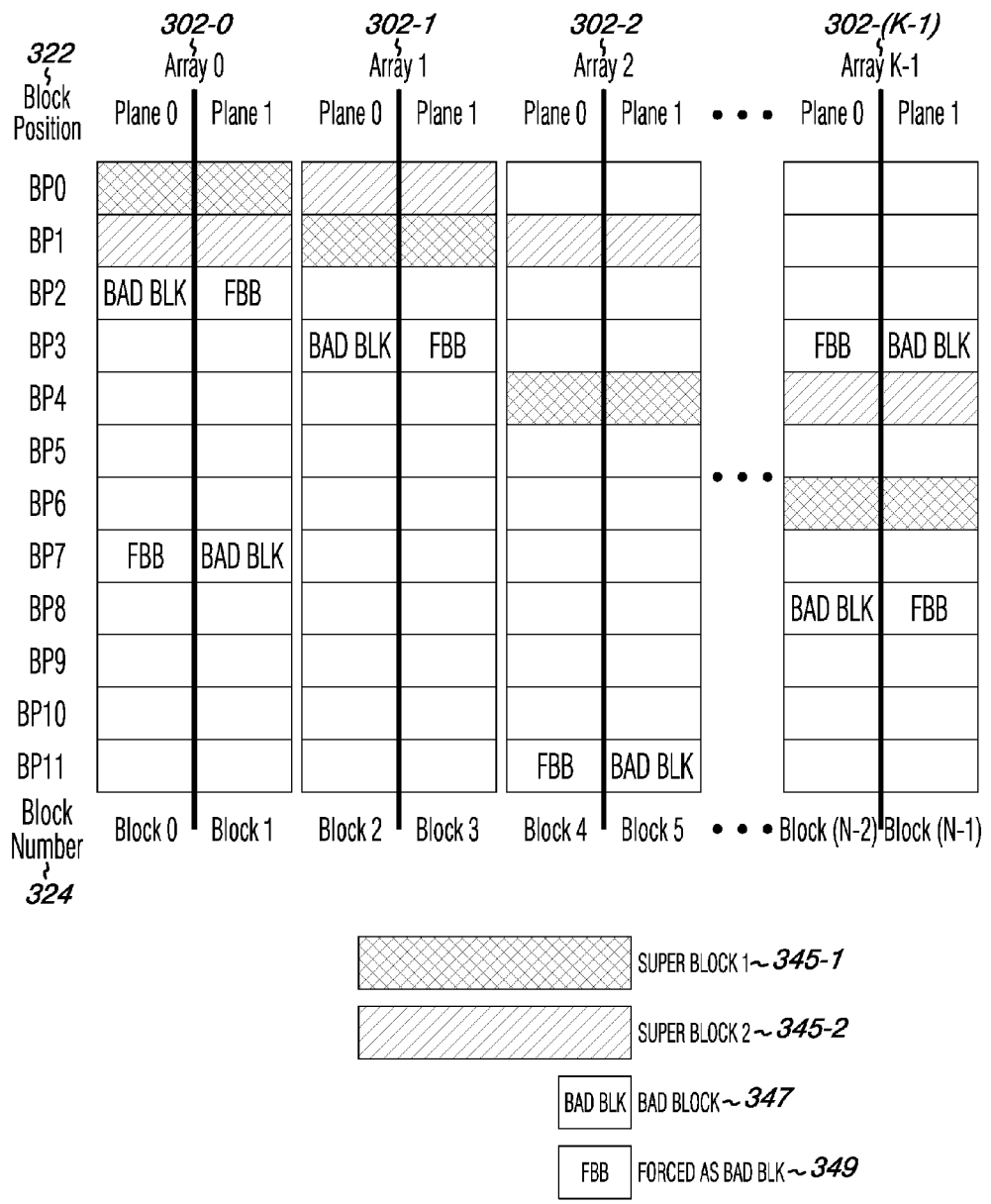
FIG. 3 illustrates a previous approach to memory block management.

FIG. 3 illustrates a previous approach to memory block management. The example shown in FIG. 3 includes a number of memory arrays 302-0, 302-1, 302-2, ..., 302-(K-1). The memory arrays 302-0, 302-1, 302-2, ..., 302-(K-1) can be analogous to memory arrays such as array 102 shown in FIG. 1 and memory arrays 202-0 and 202-1 shown in FIG. 2. The memory arrays 302-0, 302-1, 302-2, ..., 302-(K-1) can be a portion of a memory unit such as memory unit 925 described below in connection with FIG. 9. As an example, one or more of the arrays 302-0, 302-1, 302-2, ..., 302-(K-1) can be from different memory devices, e.g., from different flash memory dies or chips.

As described above in connection with FIG. 2, the arrays 302-0, 302-1, 302-2, ..., 302-(K-1) each include a number of physical blocks of memory cells, with the blocks of each array organized into planes. In this example, each array includes two planes of memory blocks, e.g., PLANE 0 and PLANE 1 as shown. Embodiments are not limited to a particular number of planes associated with a particular memory array. In the example illustrated in FIG. 3, the planes (Plane 0 and Plane 1) from each of the arrays 302-0 through 302-(K-1) are collectively organized as a single Group of planes.

As one of ordinary skill in the art will appreciate, each of the memory blocks can be identified by a physical block address (PBA). As illustrated in the example shown in FIG. 3, the physical blocks within each of the arrays 302-0, 302-1, 302-2, ..., 302-(K-1) can have a block position 322 associated therewith. In this example, there are twelve blocks (BP0 to BP11). The block position 322 associated with a block can indicate the block's physical location within its respective plane.

As illustrated in the example shown in FIG. 3, each memory array 302-0, 302-1, 302-2, ..., 302-(K-1) includes two physical blocks (one per plane) at the same block position 322. For instance, each of the arrays 302-0, 302-1, 302-2, ..., 302-(K-1) include two blocks at block position BP0, two blocks at block position BP1, etc. Embodiments of the present disclosure are not limited to a particular number of memory blocks per memory array or to a particular number of memory blocks per plane.

The example shown in FIG. 3 illustrates a block status associated with the physical memory blocks within the arrays 302-0, 302-1, 302-2, ..., 302-(K-1). For instance, the arrays 302-0, 302-1, 302-2, ..., 302-(K-1) include a number of bad blocks 347 (labeled as BAD BLK). A "bad block" refers to a block determined to be defective, e.g., unusable or unreliable for data storage. A block can be determined to be defective at various times during the lifetime of an array. For instance, defective blocks can be determined upon preliminary testing after manufacture of the arrays. Blocks can also become defective over time and can become retired from operational use as the number of programming and erase cycles performed on the blocks increases, for instance.

In the example shown in FIG. 3, the arrays 302-0, 302-1, 302-2, ..., 302-(K-1) include a number of forced bad blocks 349 (labeled as FBB). A "forced bad block" refers to a block that is treated as defective, e.g., unusable or unreliable for data storage, despite the fact that the block may be non-defective. A block may be forced as a bad block 349 for various reasons. For instance, as one of ordinary skill in the art will appreciate, some memory systems are configured such that physical blocks at the same block position within an array are addressed together for purposes of performing operations such as program and read operations. As an example, the block pairs at block position BP0 for each of the arrays 302-0, 302-1, 302-2, ..., 302-(K-1) can be addressed together. In some such systems, and in the example shown in FIG. 3, physical blocks within a particular array that share a common block position 322 with a defective block 347 are treated as forced bad blocks 349.

The example shown in FIG. 3 also illustrates a number of Super Blocks, e.g., 345-1 (SUPER BLOCK 1) and 345-2 (SUPER BLOCK 2). As described above in connection with FIG. 2, the Super Blocks can be collections of physical blocks that each includes a physical block from each plane within a corresponding Group (e.g., Groups 240-0 and 240-1 described in FIG. 2). In various embodiments, the arrays can be from different memory devices, e.g., dies or chips.

In the example shown in FIG. 3, the Super Blocks, e.g., 345-1 and 345-2, are each a collection of "N" physical blocks across the multiple arrays 302-0, 302-1, 302-2, ..., 302-(K-1). In the example illustrated in FIG. 3, each physical block within a Super Block has a particular block number 324, e.g., the "N" physical blocks within the Super Blocks are numbered Block 0 through Block (N-1) across the arrays 302-0, 302-1, 302-2, ..., 302-(K-1). As such, in this example, each Super Block, e.g., 345-1 and 345-2, is a collection of N total physical blocks, e.g., two physical blocks (one from each of PLANE 0 and PLANE 1) from each of the memory arrays 302-0, 302-1, 302-2, ..., 302-(K-1).

In this example, the physical blocks are assigned to Super Blocks such that the physical blocks corresponding to a particular Super Block can be at different block positions 322. For instance, Block 0 and Block 1 of Super Block 345-1 are at block position BP0 within array 302-0. Block 2 and Block 3 of Super Block 345-1 are at block position BP1 within array 302-1. Block 4 and Block 5 of Super Block 345-1 are at block position BP4 within array 302-2. Block (N-2) and Block (N-1) of Super Block 345-1 are at block position BP6 within array 302-(K-1). Also, Block 0 and Block 1 of Super Block 345-2 are at block position BP1 within array 302-0. Block 2 and Block 3 of Super Block 345-2 are at block position BP0 within array 302-1. Block 4 and Block 5 of Super Block 345-2 are at block position BP1 within array 302-2. Block (N-2) and Block (N-1) of Super Block 345-2 are at block position BP4 within array 302-(K-1).

Assigning N physical blocks to a Super Block, e.g., 345-1 and 345-2, in the manner illustrated in FIG. 3 can result in a need to provide a relatively large look up table (LUT) in order to provide appropriate logical block address (LBA) to physical block address (PBA) mappings corresponding to the Super Blocks. For instance, the LUT includes an entry for each individual pair of physical blocks across each of the multiple arrays 302-0, 302-1, 302-2, ..., 302-(K-1), e.g., an entry corresponding to a physical location for each block pair (one block from Plane 0 and one block from Plane 1) for each block position 322 and for each of the multiple arrays 302-0, 302-1, 302-2, ..., 302-(K-1). Also, assigning physical blocks in the manner described in connection with the example shown in FIG. 3 can result in N/2 searches of the LUT in order to determine the physical location of each block pair in a particular Super Block, e.g., 345-1 and 345-2, based on a particular LBA received in conjunction with an operation, e.g., a program, erase, and/or read operation. In one or more embodiments, when a particular physical block has been assigned to a particular Super Block, it is not later reassigned to a different Super Block.

Factors such as the size of a particular LUT and the number of searches of the LUT used to determine the particular physical blocks assigned to a particular Super Block can impact various aspects of system performance. For instance, a relatively large LUT can take up large amounts of storage space, e.g., in RAM on a controller or within the memory arrays themselves, depending on where the LUT is stored. Also, large numbers of LUT searches associated with performing programming, reading, and erasing operations can reduce system throughput by slowing the execution time associated with the particular operation.

Figure 4:
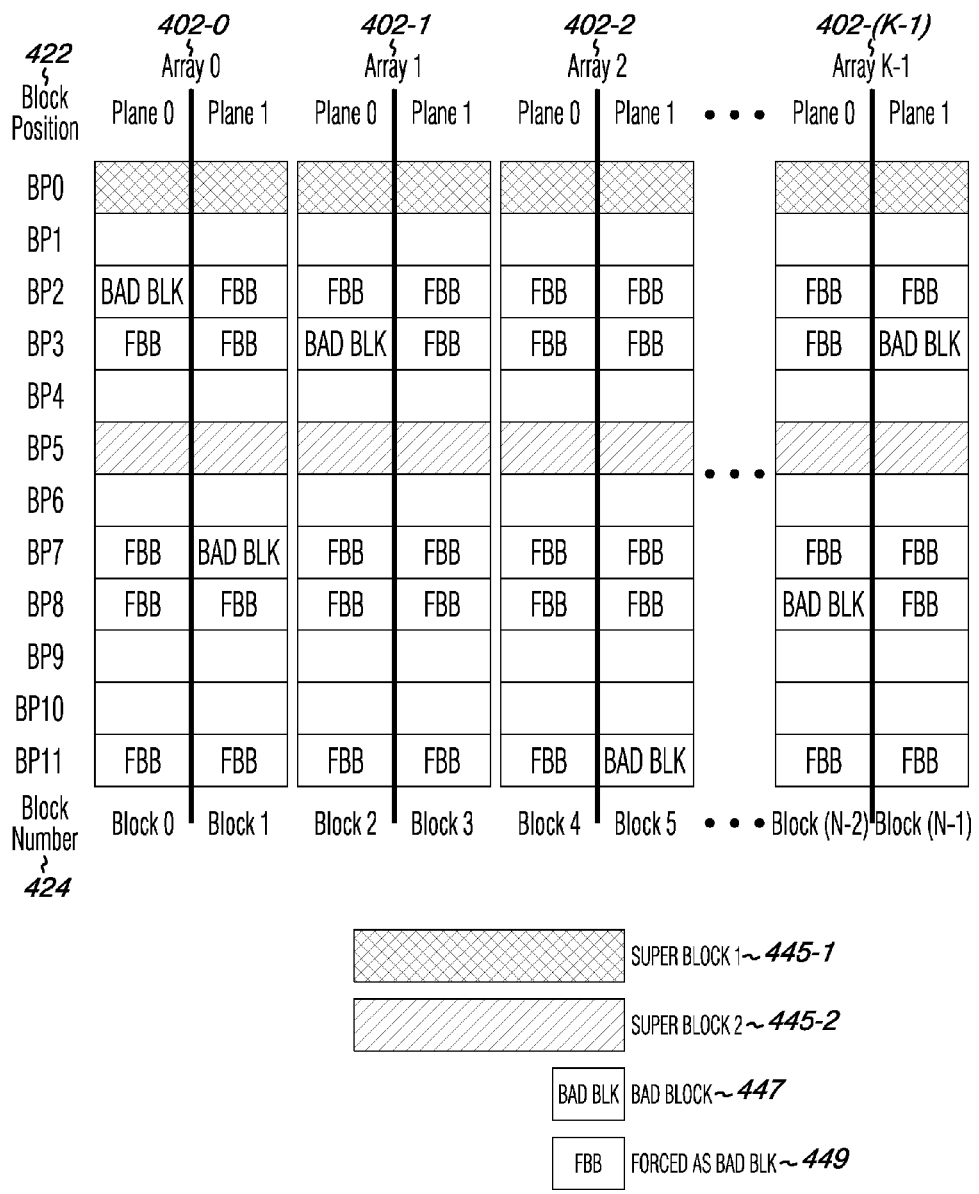
FIG. 4 illustrates another previous approach to memory block management.

FIG. 4 illustrates another previous approach to memory block management. The example shown in FIG. 4 includes a number of memory arrays 402-0, 402-1, 402-2, . . . , 402-(K-1). The memory arrays 402-0, 402-1, 402-2, . . . , 402-(K-1) can be analogous to memory arrays such as array 102 shown in FIG. 1 and memory arrays 202-0 and 202-1 shown in FIG. 2. The memory arrays 402-0, 402-1, 402-2, . . . , 402-(K-1) can be a portion of a memory unit such as memory unit 925 described below in connection with FIG. 9. As an example, one or more of the arrays 402-0, 402-1, 402-2, . . . , 402-(K-1) can be from different memory devices, e.g., from different flash memory dies or chips.

As described above in connection with FIGS. 2 and 3, the arrays 402-0, 402-1, 402-2, . . . , 402-(K-1) each include a number of physical blocks of memory cells, with the blocks of each array organized into planes, e.g., PLANE 0 and PLANE 1 as shown in this example. As illustrated in the example shown in FIG. 4, the physical blocks within each of the arrays 402-0, 402-1, 402-2, . . . , 402-(K-1) can have a block position 422 associated therewith. In this example, there are twelve block positions: BP0 to BP11. The block position 422 of a block can indicate the block's physical location within its respective plane.

Similar to the example shown in FIG. 3, each memory array 402-0, 402-1, 402-2, . . . , 402-(K-1) includes two physical blocks (one per plane) at the same block position 422. For instance, each of the arrays 402-0, 402-1, 402-2, . . . , 402-(K-1) include two blocks at block position BP0, two blocks at block position BP1, etc. In the example illustrated in FIG. 4, the planes (Plane 0 and Plane 1) from each of the arrays 402-0 through 402-(K-1) are collectively organized as a single Group of planes.

The example shown in FIG. 4 illustrates a block status associated with the physical memory blocks within the arrays 402-0, 402-1, 402-2, . . . , 402-(K-1). For instance, as described above in connection with FIG. 3, the arrays 402-0, 402-1, 402-2, . . . , 402-(K-1) include a number of bad blocks 447 (labeled as BAD BLK) as well as a number of forced bad blocks 449 (labeled as FBB).

In this example, and as described in connection with FIG. 3, physical blocks at the same block position within an array are addressed together for purposes of performing operations such as program and read operations. As such, in the example shown in FIG. 4, physical blocks of the Group that share a common block position 422 with a defective block 447 are treated as forced bad blocks 449. For instance, in array 402-0, the physical block of Plane 1 having block position BP2 is a forced bad block 449 since it shares block position BP2 with defective block 447 of Plane 0.

The example shown in FIG. 4 also illustrates a number of Super Blocks, e.g., 445-1 (SUPER BLOCK 1) and 445-2 (SUPER BLOCK 2). As described above in connection with FIGS. 2 and 3, the Super Blocks can be collections of physical blocks from each of at least two different planes with no more than one physical block from a particular plane. In the example shown in FIG. 4, the Super Blocks, e.g., 445-1 and 445-2, are each a collection of "N" physical blocks across the multiple arrays 402-0, 402-1, 402-2, . . . , 402-(K-1). In the example illustrated in FIG. 4, each physical block within a Super Block has a particular block number 424, e.g., the "N" physical blocks within the Super Blocks are numbered Block 0 through Block (N-1) across the arrays 402-0, 402-1, 402-2, . . . , 402-(K-1). As such, in this example, each Super Block, e.g., 445-1 and 445-2, is a collection of N total physical blocks, e.g., two physical blocks (one from each of PLANE 0 and PLANE 1) from each of the memory arrays 402-0, 402-1, 402-2, . . . , 402-(K-1).

In this example, the physical blocks are assigned to Super Blocks such that the physical blocks corresponding to a particular Super Block are each at the same block position 422. That is, each physical block, e.g., Block 0 through Block (N-1), of a particular Super Block, is at the same block position 422 within its plane. For instance, Super Block 445-1 includes all the physical blocks at block position BP0 across the arrays 402-0 through 402-(K-1). Also, Super Block 445-2 includes all the physical blocks at block position BP5 across the arrays 402-0 through 402-(K-1).

However, since the physical blocks assigned to the Super Blocks in the example shown in FIG. 4 each share the same block position 422, if one of the arrays 402-0 through 402-(K-1) includes a bad block 447 at a particular block position, such as block position BP2, then all of the other physical blocks in a prospective Super Block including bad block 447 will be forced as bad blocks 449. Accordingly, the physical blocks at that particular position 422 will not be assigned to a Super Block. For example, since the physical block located at BP2 of Plane 1 within array 402-0 includes a bad block 447, no physical blocks at the BP2 position will be assigned to a Super Block. Similarly, each of the physical blocks at block positions BP3, BP7, BP8, and BP11 are also not assigned to a Super Block (since there is a bad block 447 at each of those block positions). As such, otherwise non-defective physical blocks associated at those block positions are treated as defective for purposes of Super Block assignment.

Assigning N physical blocks to a Super Block, e.g., 445-1 or 445-2, in the manner illustrated in FIG. 4 can reduce the amount of available Super Blocks within the Group of planes associated with arrays 402-0, 402-1, 402-2, . . . , 402-(K-1). For instance, in the example illustrated in FIG. 4, physical blocks at five of the twelve block positions, e.g., BP2, BP3, BP7, BP8, and BP11, are unavailable for assignment of a Super Block thereto. However, since the physical blocks of each Super Block, e.g., 445-1 and 445-2, are at the same block position 422, only one entry in a LUT is required for mapping a logical block address to a particular physical Super Block. As such, the size of the LUT can be smaller than the example described in connection with FIG. 3, and the time to reconstruct a Super Block is reduced since a single table search can result in the appropriate physical location of the physical blocks corresponding to a particular Super Block. Assigning N physical blocks to a Super Block, e.g., 445-1 or 445-2, in the manner illustrated in FIG. 4 can reduce the LUT storage space and the Super Block reconstruction time by a factor of N/2 as compared to the example described in connection with FIG. 3.

Figure 5:
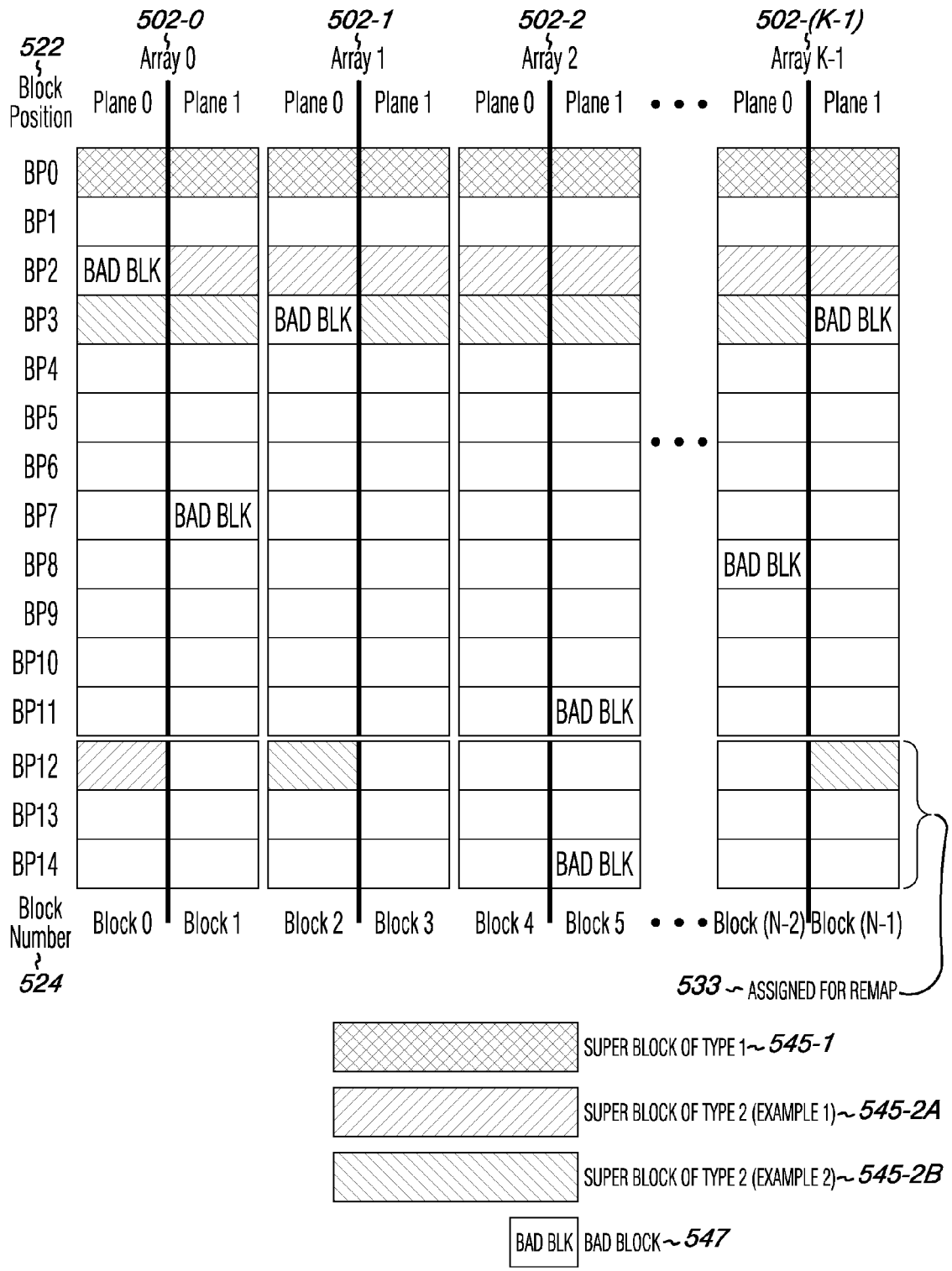
FIG. 5 illustrates memory block management in accordance with one or more embodiments of the present disclosure.

FIG. 5 illustrates memory block management in accordance with one or more embodiments of the present disclosure. The embodiment shown in FIG. 5 includes a number of memory arrays 502-0, 502-1, 502-2, . . . , 502-(K-1). The memory arrays 502-0, 502-1, 502-2, . . . , 502-(K-1) can be analogous to memory arrays such as array 102 shown in FIG. 1 and memory arrays 202-0 and 202-1 shown in FIG. 2. The memory arrays 502-0, 502-1, 502-2, . . . , 502-(K-1) can be a portion of a memory unit such as memory unit 925 described below in connection with FIG. 9. As an example, one or more of the arrays 502-0, 502-1, 502-2, . . . , 502-(K-1) can be from different memory devices, e.g., from different flash memory dies or chips.

As described above in connection with FIGS. 2, 3, and 4, the arrays 502-0, 502-1, 502-2, . . . , 502-(K-1) each include a number of physical blocks of memory cells, with the blocks of each array organized into planes, e.g., PLANE 0 and PLANE 1 as shown. As illustrated in the embodiment shown in FIG. 5, the physical blocks within each of the arrays 502-0, 502-1, 502-2, . . . , 502-(K-1) can have a block position 522 associated therewith. In this example, there are fifteen block positions: BP0 to BP14. The block position 522 of a block can indicate the block's physical location within its respective plane.

Similar to the examples shown in FIGS. 3 and 4, each memory array 502-0, 502-1, 502-2, . . . , 502-(K-1) includes two physical blocks (one per plane) at the same block position 522. For instance, each of the arrays 502-0, 502-1, 502-2, . . . , 502-(K-1) include two blocks at block position number BP0, two blocks at block position BP1, etc. In the example illustrated in FIG. 5, the planes (Plane 0 and Plane 1) from each of the arrays 502-0 through 502-(K-1) are collectively organized as a single Group of planes.

The embodiment shown in FIG. 5 includes a block status associated with the physical memory blocks within the arrays 502-0, 502-1, 502-2, . . . , 502-(K-1). For instance, as described above in connection with FIGS. 3 and 4, the arrays 502-0, 502-1, 502-2, . . . , 502-(K-1) include a number of bad blocks 547 (labeled as BAD BLK). In the embodiment illustrated in FIG. 5, empty blocks represent non-defective physical blocks, while shaded blocks represent physical blocks assigned to a particular Super Block. As noted above, a Super Block can be a collection of physical blocks from each of at least two different planes and having no more than one physical block from a particular one of those planes.

In the embodiment shown in FIG. 5, the Super Blocks, e.g., 545-1, 545-2A, and 545-2B, are each a collection of "N" physical blocks across the multiple arrays 502-0, 502-1, 502-2, . . . , 502-(K-1). In the example illustrated in FIG. 5, each physical block within a Super Block has a particular block number 524, e.g., the "N" physical blocks within the Super Blocks are numbered Block 0 through Block (N-1) across the arrays 502-0, 502-1, 502-2, . . . , 502-(K-1). As such, in this example, each Super Block, e.g., 545-1, 545-2A, and 545-2B, is a collection of N total physical blocks, e.g., two physical blocks (one from each of PLANE 0 and PLANE 1) from each of the memory arrays 502-0, 502-1, 502-2, . . . , 502-(K-1).

In one or more embodiments, and as illustrated in FIG. 5, each of the Super Blocks, e.g., 545-1, 545-2A, and 545-2B, includes each physical block at the same particular block position 522 of at least two different planes that has not been determined to be defective (hereinafter a "non-defective block") and a replacement physical block for each bad physical block at the same particular block position as the non-defective physical blocks, with the replacement physical block being at a different block position than the non-defective physical blocks. As an example, in the embodiment illustrated in FIG. 5, if each of the physical blocks at a particular block position 522 across the arrays 502-0 through 502-(K-1) is a non-defective block, then all of the physical blocks at that particular block position are assigned to a particular Super Block, e.g., 545-1 in this embodiment.

However, if one or more of the physical blocks at a particular block position 522 across the arrays 502-0 through 502-(K-1) is a bad block 547, then each of the non-defective blocks at that particular block position 522 are assigned to a particular Super Block, e.g., 545-2A, in which one or more replacement physical blocks are assigned to the particular Super Block, e.g., 545-2A, as replacements for the one or more bad physical blocks 547 at the particular block position.

In one or more embodiments, and as illustrated in FIG. 5, the replacement physical block is from the same plane as the bad physical block 547 which it is replacing in the particular Super Block, e.g., 545-2A and 545-2B. In one or more embodiments, control circuitry coupled to the memory arrays, e.g., 502-0 through 502-(K-1), is configured to map the bad physical blocks 547 at the particular block position 522 to the replacement physical blocks at the different block position.

As such, the embodiment illustrated in FIG. 5, includes two types of Super Blocks. For instance, the physical blocks at a particular block position 522 that has no bad blocks 547 associated therewith are assigned to a first type of Super Block, e.g., Super Block 545-1. As shown in FIG. 5, all of the physical blocks at block position BP0 are assigned to Super Block 545-1.

In the embodiment illustrated in FIG. 5, the non-defective physical blocks at a particular block position 522, which has one or more bad blocks 547 associated therewith, are assigned to a second type of Super Block that also includes replacement physical blocks assigned thereto, e.g., Super Blocks 545-2A or 545-2B. For instance, as shown in FIG. 5, the physical block located at block position BP 2 within Plane 0 of array 502-0 is a bad block 547. As such, a replacement block, e.g., the physical block located at block position BP12 within Plane 0 of array 502-0, is assigned to Super Block 545-2A along with the non-defective blocks at block position BP2. That is block number Block 0 of Super Block 545-2A is a replacement block. As another example, the physical blocks at block position BP3 include two bad blocks 547, e.g., the block within Plane 0 of array 502-1 and the block within Plane 1 of array 502-(K-1). As such, block number Block 2 and block number Block (N-1) of Super Block 545-2B are replacement blocks, e.g., the physical block located at block position BP12 within Plane 0 of array 502-1 and the physical block located at block position BP12 within Plane 1 of array 502-(K-1) are assigned to Super Block 545-2B as replacement blocks for the respective bad blocks 547 at block position BP3.

As such, in the embodiment illustrated in FIG. 5, the physical blocks are assigned to Super Blocks in such a way that the physical blocks assigned to a first type, e.g., 545-1, of Super Block are each at the same block position 522. That is, each physical block, e.g., Block 0 through Block (N-1), of a particular first type of Super Block are at the same block position 522. In such an embodiment, physical blocks are also assigned to Super Blocks in such a way that at least one of the physical blocks assigned to a second type, e.g., 545-2A or 545-2B, of Super Block are at a different block position 522. That is, the replacement physical block(s) assigned to a particular second type of Super Block are at a different block position 522 than the non-defective blocks assigned to that particular Super Block.

In one or more embodiments, a memory controller, e.g., memory controller 920 described in connection with FIG. 9, can include control circuitry configured to assign a particular number of physical blocks within each plane, e.g., Plane 0 and Plane 1, to be used to replace bad physical blocks 547 within the plane. For instance, in the embodiment illustrated in FIG. 5, the arrays 502-0 through 502-(K-1) include a portion 533 assigned for remapping. In this embodiment, each of the physical blocks at block positions BP12, BP13, and BP14, are assigned for replacing a bad block 547 in their respective plane and can be assigned to a particular Super Block of type 2, e.g., 545-2A or 545-2B. The replacement physical blocks can be used for remapping bad blocks to non-defective physical blocks. In one or more embodiments, the control circuitry can be configured to assign a predetermined number of physical blocks within each plane to be used to replace bad physical blocks 547 within the plane.

In one or more embodiments, the particular number of physical blocks assigned to be used to replace bad physical blocks is based, at least partially, on an uppermost expected number of defective blocks per plane. For instance, a manufacturer of the memory arrays 502-0 through 502-(K-1) may indicate that not more than about 2% to about 4% of the physical blocks per plane will be defective over the life of the arrays. For example, not more than about 2% to about 4% of the physical blocks in the arrays 502-0 through 502-(K-1) will be bad blocks 547. In various embodiments, the particular number of physical blocks assigned for remapping 533 does not exceed the uppermost expected number of defective blocks per plane. That is, in various embodiments, the portion 533 assigned for remapping may be about 2% to about 4% of the total number of physical blocks per plane. Embodiments of the present disclosure are not limited to a particular expected percentage of, or number of, defective blocks per plane.

As noted above, in one or more embodiments, the number of expected defective blocks per plane can include "original" defective blocks (e.g., blocks that are defective at the time of manufacture and/or by preliminary testing) as well as blocks which are functionally good at the time of manufacture and preliminary testing, but become defective during the life of a memory device (e.g., a flash memory device). Blocks which become defective after preliminary testing (e.g., during the life of the device) can be referred to as "grown" defective blocks. As such, the number of expected defective blocks associated with a particular plane can include the original defective blocks as well as the grown defective blocks from each plane.

In one or more embodiments, a replacement block from the portion 533 for remapping can also be used to replace blocks that are determined to be defective during use of the memory device (e.g., to replace grown defective blocks). In such embodiments, the Super Block which contained the grown defective block can remain the same; however, the grown defective physical block will be dynamically replaced with a physical block from the portion 533 for remapping.

Assigning N physical blocks to a Super Block, e.g., 545-1, 545-2A or 545-2B, in the manner illustrated in FIG. 5 can provide improved block management efficiency as compared to the previous approaches described in connection with FIGS. 3 and 4. For instance, in the embodiment illustrated in FIG. 5, a single LBA to PBA mapping entry in a LUT can be used to locate the physical blocks assigned to a Super Block of type 1, e.g., 545-1, since the physical blocks corresponding to a Super Block of type 1 are at a common block position 522. Also, unlike in the example illustrated in FIG. 4, physical blocks that share a block position n with one or more bad blocks 547 can be assigned to a Super Block of type 2, e.g., 545-2A or 545-2B, which can reduce the inefficiency associated with forced bad blocks.

As described further below in connection with FIGS. 8A-8C, a separate LUT can be used to map LBAs to PBAs for Super Blocks of type 2. The storage space used for storing the LUT used to map LBAs to PBAs for Super Blocks of type 2 can be small as compared to the LUT used to map LBAs to PBAs for Super Blocks of type 1. For instance, since there can be a relatively small number, e.g., 2-4%, of bad blocks 547, the number of Super Blocks of type 2 can be small as compared to the number of Super Blocks of type 1.

Figure 6:
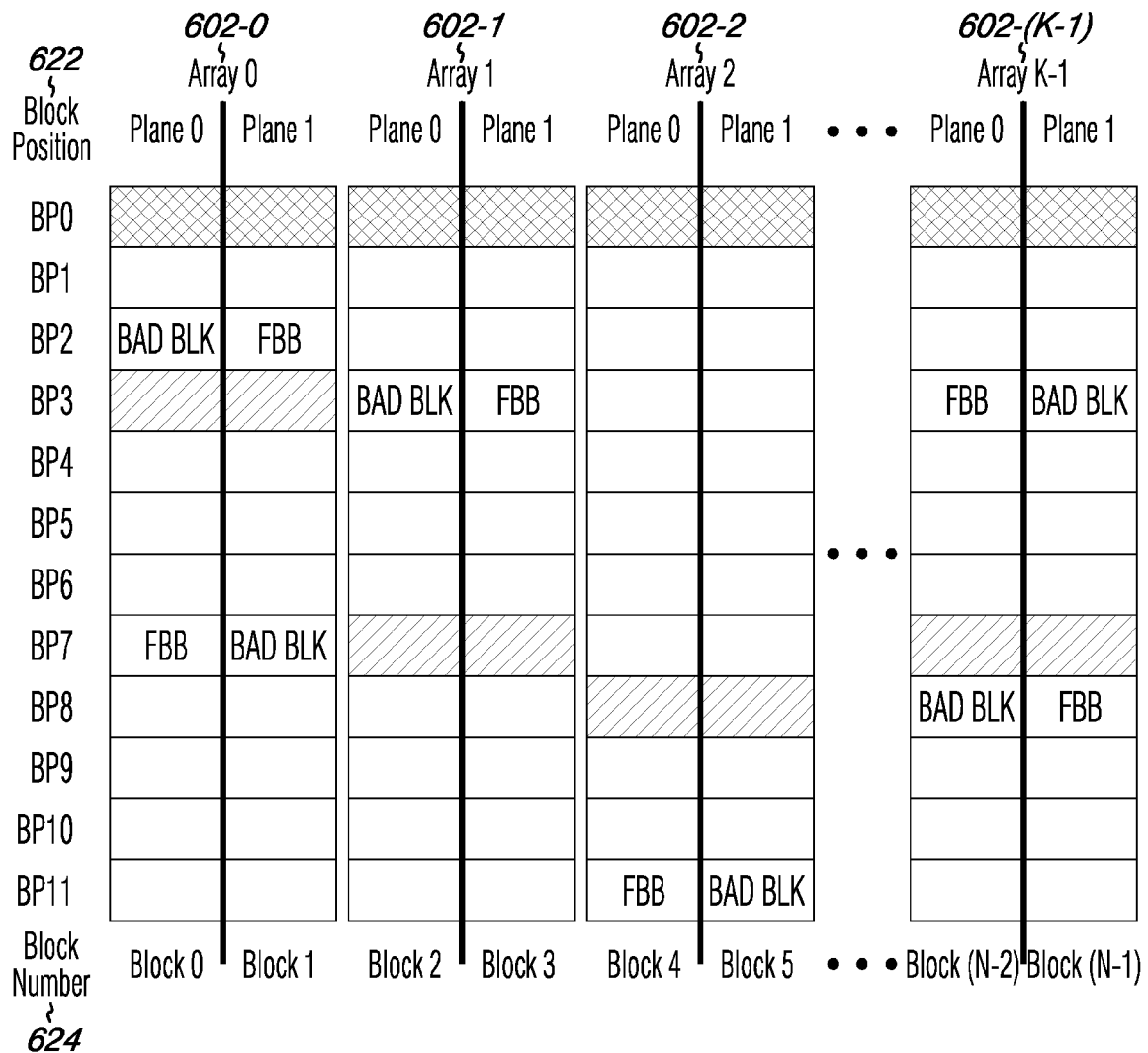
FIG. 6 illustrates memory block management in accordance with one or more embodiments of the present disclosure.

FIG. 6 illustrates memory block management in accordance with one or more embodiments of the present disclosure. The embodiment shown in FIG. 6 includes a number of memory arrays 602-0, 602-1, 602-2, . . . , 602-(K-1). The memory arrays 602-0, 602-1, 602-2, . . . , 602-(K-1) can be analogous to memory arrays such as array 102 shown in FIG. 1 and memory arrays 202-0 and 202-1 shown in FIG. 2. The memory arrays 602-0, 602-1, 602-2, . . . , 602-(K-1) can be a portion of a memory unit such as memory unit 925 described below in connection with FIG. 9. As an example, one or more of the arrays 602-0, 602-1, 602-2, . . . , 602-(K-1) can be from different memory devices, e.g., from different flash memory dies or chips.

As described above in connection with FIGS. 2, 3, 4, and 5, the arrays 602-0, 602-1, 602-2, . . . , 602-(K-1) each include a number of physical blocks of memory cells, with the blocks of each array organized into planes, e.g., PLANE 0 and PLANE 1 as shown. As illustrated in the embodiment shown in FIG. 6, the physical blocks within each plane of the arrays 602-0, 602-1, 602-2, . . . , 602-(K-1) are at a different block position 622 associated therewith. In this example, there are twelve block positions: BP0 to BP11. The block position 622 of a block can indicate the block's physical location within its respective plane.

Similar to the examples shown in FIGS. 3 and 4, each memory array 602-0, 602-1, 602-2, . . . , 602-(K-1) includes two physical blocks (one per plane) at the same block position 622. For instance, each of the arrays 602-0, 602-1, 602-2, . . . , 602-(K-1) include two blocks at block position BP0, two blocks having position number BP1, etc. In the example illustrated in FIG. 6, the planes (Plane 0 and Plane 1) from each of the arrays 602-0 through 602-(K-1) are collectively organized as a single Group of planes (e.g., Group 240-0 or 240-1 shown in FIG. 2).

The embodiment shown in FIG. 6 includes a block status associated with the physical memory blocks within the arrays 602-0, 602-1, 602-2, . . . , 602-(K-1). For instance, as described above in connection with FIGS. 3 and 4, the arrays 602-0, 602-1, 602-2, . . . , 602-(K-1) include a number of bad blocks 647 (labeled as BAD BLK) as well as a number of forced bad blocks 649 (labeled as FBB). In the embodiment illustrated in FIG. 6, empty blocks represent non-defective physical blocks, while shaded blocks represent physical blocks assigned to a particular Super Block. As noted above, a Super Block can be a collection of physical blocks from each of at least two different planes and have no more than one physical block from a particular one of the planes.

In the embodiment illustrated in FIG. 6, and as described in connection with FIGS. 3 and 4, physical blocks at the same block position within an array are addressed together for purposes of performing operations such as program and read operations. As such, in the embodiment shown in FIG. 6, non-defective physical blocks at a common block position 622 within a particular array as a bad block 647 are forced bad blocks 649. For instance, in array 602-0, the physical block of Plane 1 at block position BP2 is a forced bad block 649 since it shares block position BP2 with bad block 647 of Plane 0.

Similar to the embodiment described in connection with FIG. 5, the embodiment illustrated in FIG. 6 includes two types of Super Blocks, e.g., type 1 645-1 and type 2 645-2. Each Super Block is a collection of "N" physical blocks across the multiple arrays 602-0, 602-1, 602-2, . . . , 602-(K-1). In the embodiment illustrated in FIG. 6, each physical block within a Super Block has a particular block number 624, e.g., the "N" physical blocks within the Super Blocks are numbered Block 0 through Block (N-1) across the arrays 602-0, 602-1, 602-2, . . . , 602-(K-1). As such, in the embodiment illustrated in FIG. 6, each Super Block, e.g., 645-1 and 645-2, is a collection of N total physical blocks, e.g., two physical blocks (one from each of PLANE 0 and PLANE 1) from each of the memory arrays 602-0, 602-1, 602-2, . . . , 602-(K-1).

In the embodiment illustrated in FIG. 6, each of the Super Blocks of the first type, e.g., 645-1 includes all of the non-defective physical blocks at a same particular block position 622 of at least two different memory arrays. That is, there are no bad blocks 647 or forced bad blocks 649 at the block position 622 of the physical blocks assigned to a Super Block of type 1, e.g., 645-1.

In the embodiment illustrated in FIG. 6, non-defective physical blocks at the same block position 622 as a bad block 647 are available for assignment to a Super Block of type 2, e.g., 645-2. For instance, the non-defective physical blocks located at block position BP3 within Plane 0 and Plane 1 of array 602-0 (where bad blocks 647 are also located at BP3, such as within Plane 0 of array 602-1 and within Plane 1 of array 602-(K-1)) are assigned to Super Block 645-2, e.g., as Block 0 and Block 1 of Super Block 645-2. The non-defective physical blocks located at block position BP7 within Plane 0 and Plane 1 of array 602-1 (where a bad block 647 is also located at block position BP7 within Plane 1 of array 602-0) are also assigned to Super Block 645-2, e.g., as Block 2 and Block 3 of Super Block 645-2. In addition, the non-defective physical blocks located at block position BP8 within Plane 0 and Plane 1 of array 602-2 (where a bad block 647 is also located at block position BP8 within Plane 0 of array 602-(K-1)) are assigned to Super Block 645-2, e.g., as Block 4 and Block 5 of Super Block 645-2. Also, the non-defective physical blocks located at block position BP7 within Plane 0 and Plane 1 of array 602-(K-1) (where a bad block 647 is also located at block position BP7 within Plane 1 of array 602-0) is assigned to Super Block 645-2, e.g., as Block (N-2) and Block (N-1) of Super Block 645-2.

Figure 9:
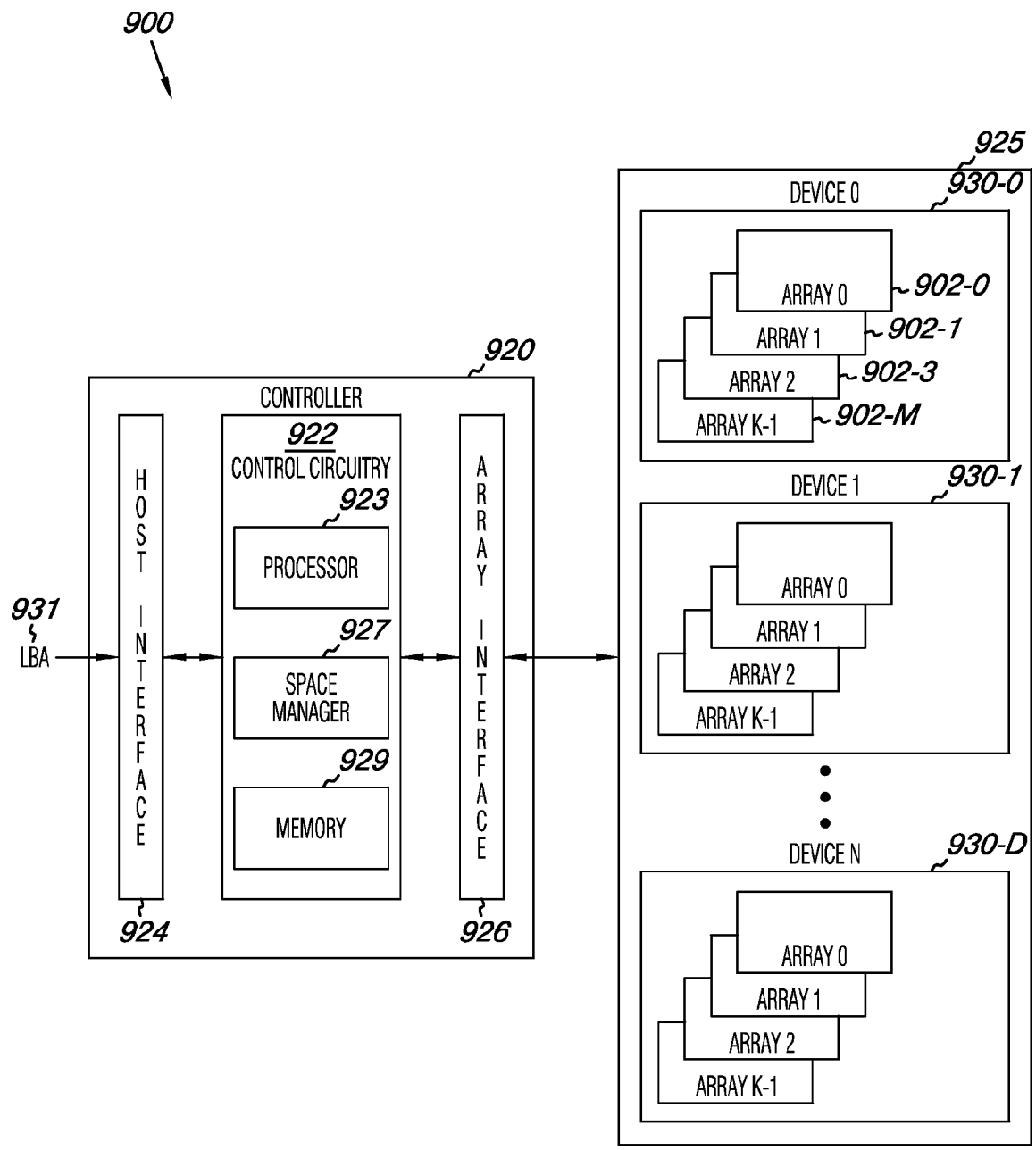
FIG. 9 is a functional block diagram of an electronic memory system in accordance with one or more embodiments of the present disclosure.

In one or more embodiments, a memory controller, e.g., memory controller 920 described in FIG. 9, can include control circuitry configured to prevent non-defective blocks at the same block position 622 as a bad block 647, and within the same array, from being assigned to a Super Block of the second type. For instance, as illustrated in FIG. 6, physical blocks that share a common block position and are in the same array as a bad block 647 are forced as bad blocks 649 such that they are prevented from being assigned to a Super Block of type 2, e.g., 645-2.

Assigning N physical blocks to a Super Block, e.g., 645-1 or 645-2, in the manner illustrated in FIG. 6 can provide improved block management efficiency as compared to the previous approaches described in connection with FIGS. 3 and 4. For instance, in the embodiment illustrated in FIG. 6, a single LBA to PBA mapping entry in a LUT can be used to locate the physical blocks assigned to a Super Block of type 1, e.g., 645-1, since the physical blocks corresponding to a Super Block of type 1 share a common block position 622. Also, unlike in the example illustrated in FIG. 4, non-defective physical blocks that share a common block position with one or more bad blocks 647 are available to be assigned to a Super Block of type 2, e.g., 645-2.

Similar to the embodiment of FIG. 5, and as described farther below in connection with FIGS. 8A-8C, a separate LUT can be used to map LBAs to PBAs for Super Blocks of type 2. The storage space used for storing the LUT used to map LBAs to PBAs for Super Blocks of type 2 can be small as compared to the LUT used to map LBAs to PBAs for Super Blocks of type 1. For instance, since there can be a relatively small number, e.g., 2-4%, of bad blocks 647, the number of Super Blocks of type 2 can be small as compared to the number of Super Blocks of type 1.

Figure 7:
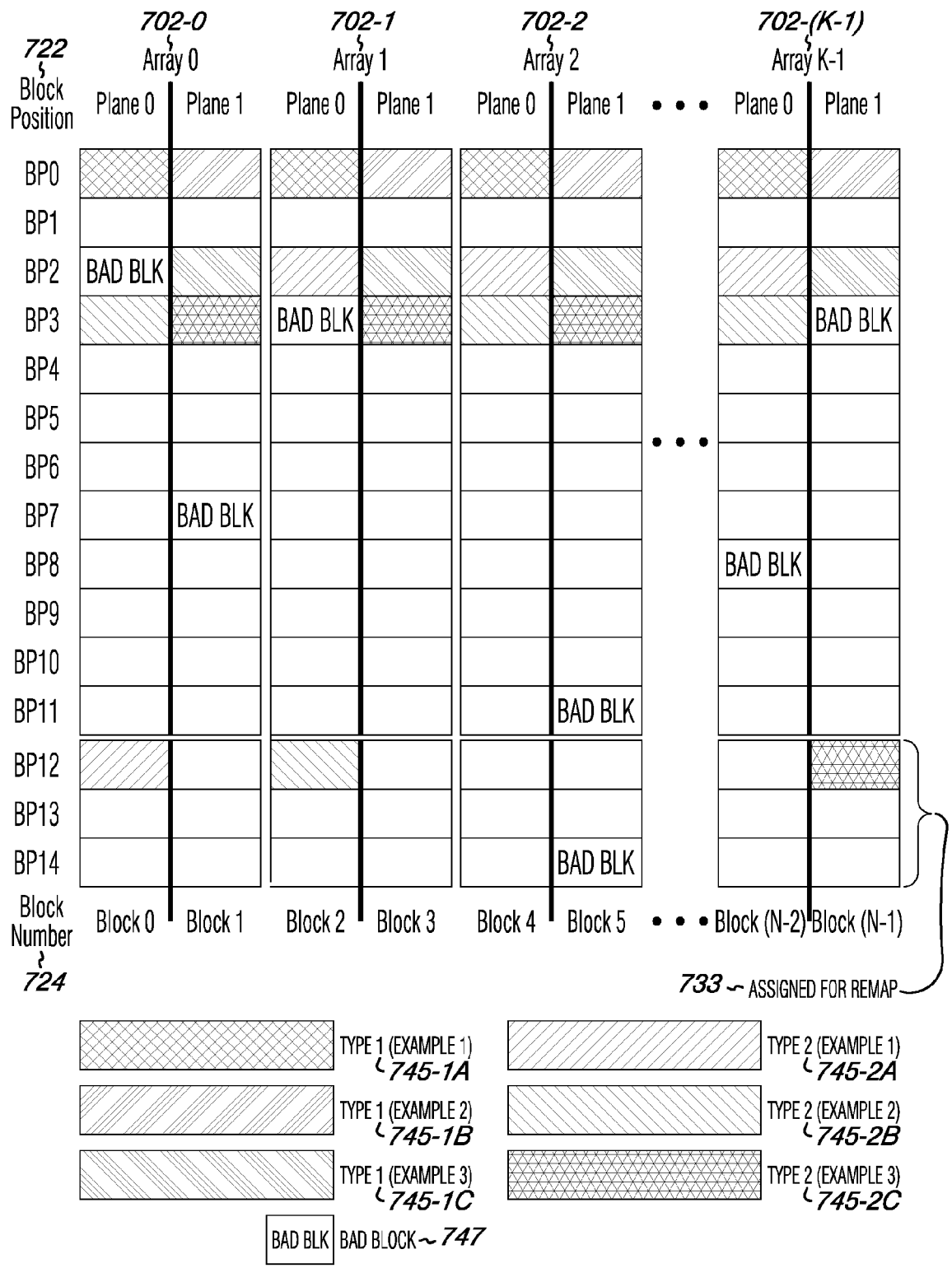
FIG. 7 illustrates memory block management in accordance with one or more embodiments of the present disclosure.

FIG. 7 illustrates memory block management in accordance with one or more embodiments of the present disclosure. The embodiment shown in FIG. 7 includes a number of memory arrays 702-0, 702-1, 702-2, . . . , 702-(K-1). The memory arrays 702-0, 702-1, 702-2, . . . , 702-(K-1) can be analogous to memory arrays such as array 102 shown in FIG. 1 and memory arrays 202-0 and 202-1 shown in FIG. 2. The memory arrays 702-0, 702-1, 702-2, . . . , 702-(K-1) can be a portion of a memory unit such as memory unit 925 described below in connection with FIG. 9. As an example, one or more of the arrays 702-0, 702-1, 702-2, . . . , 702-(K-1) can be from different memory devices, e.g., from different flash memory dies or chips.

As described above in connection with FIGS. 2 through 6, the arrays 702-0, 702-1, 702-2, . . . , 702-(K-1) each include a number of physical blocks of memory cells, with the blocks of each array organized into planes, e.g., PLANE 0 and PLANE 1 as shown. As illustrated in the embodiment shown in FIG. 7, the physical blocks within each of the arrays 702-0, 702-1, 702-2, . . . , 702-(K-1) can have a block position 722 associated therewith. In this example, there are fifteen block positions: BP0 to BP14. The block position 722 of a block can indicate the block's physical location within its respective plane.

In the embodiment shown in FIG. 7, each memory array 702-0, 702-1, 702-2, . . . , 702-(K-1) includes two physical blocks (one per plane) at the same block position 722. For instance, each of the arrays 702-0, 702-1, 702-2, . . . , 702-(K-1) include two blocks at block position BP0, two blocks at block position BP1, etc. In the example illustrated in FIG. 7, the planes (Plane 0 and Plane 1) from each of the arrays 702-0 through 702-(K-1) are organized as two respective Groups of planes.

The embodiment shown in FIG. 7 includes a block status associated with the physical memory blocks within the arrays 702-0, 702-1, 702-2, . . . , 702-(K-1). For instance, as described above, the arrays 702-0, 702-1, 702-2, . . . , 702-(K-1) include a number of bad blocks 747 (labeled as BAD BLK). In the embodiment illustrated in FIG. 7, empty blocks represent non-defective physical blocks, while shaded blocks represent physical blocks assigned to a particular Super Block. As noted above, a Super Block can be a collection of physical blocks from each of at least two different planes and have no more than one physical block from a particular one of the planes.

The embodiment illustrated in FIG. 7 is analogous to the embodiment described in connection with FIG. 5 with the exception that the Super Blocks are each a collection of "N/2" physical blocks as opposed to "N" physical blocks across the multiple arrays 702-0, 702-1, 702-2, . . . , 702-(K-1). In the example illustrated in FIG. 7, each physical block within a Super Block has a particular block number 724, e.g., the "N/2" physical blocks within the Super Blocks are either the even numbered or odd numbered of Block 0 through Block (N-1) across the arrays 702-0, 702-1, 702-2, . . . , 702-(K-1).

As such, in this embodiment, each Super Block, e.g., 745-1A, 745-1B, and 745-1C, 745-2A, 745-2B, and 745-2C, is a collection of N/2 total physical blocks, e.g., one physical block from either PLANE 0 or PLANE 1 from each of the memory arrays 702-0, 702-1, 702-2, . . . , 702-(K-1).

For instance, a Super Block of type 1, e.g., 745-1A, includes physical blocks located at block position BP0 within Plane 0 of each of the arrays 702-0 through 702-(K-1). Another Super Block of type 1, e.g., 745-1B, includes physical blocks located at block position BP0 within Plane 1 of each of the arrays 702-0 through 702-(K-1). Still another Super Block of type 1, e.g., 745-1C, includes physical blocks located at block position BP2 within Plane 1 of each of the arrays 702-0 through 702-(K-1).

Similar to the embodiment described in FIG. 5, if one or more of the physical blocks at a particular block position 722 across the arrays 702-0 through 702-(K-1) is a bad block 747, then each of the non-defective blocks at that particular block position 722 are assigned to a particular Super Block, e.g., 745-2A, in which one or more replacement physical blocks are assigned to the particular Super Block, e.g., 745-2A, as replacements for the one or more bad physical blocks 747 at the particular block position. In one or more embodiments, and as illustrated in FIG. 7, the replacement physical block is from the same plane as the bad physical block 747 which it is replacing in the particular Super Block, e.g., 745-2A, 745-2B, or 745-2C. In one or more embodiments, control circuitry coupled to the memory arrays, e.g., 702-0 through 702-(K-1), is configured to map the bad physical blocks 747 at the particular block position 722 to the replacement physical blocks at the different block position. As such, the embodiment illustrated in FIG. 7, includes two types of Super Blocks: 745-1 and 745-2.

In the embodiment illustrated in FIG. 7, non-defective physical blocks that share a particular block position 722 with one or more bad blocks 747, are assigned to a second type of Super Block that also includes a replacement physical block assigned thereto, e.g., Super Blocks 745-2A, 745-2B, or 745-2C. For instance, as shown in FIG. 7, the physical block located at block position BP 2 within Plane 0 of array 702-0 is a bad block 747. As such, a replacement block, e.g., the physical block located at block position BP12 within Plane 0 of array 702-0, is assigned to Super Block 745-2A along with the non-defective blocks at the block position BP2 within Plane 0 of arrays 702-1 through 702-(K-1). That is block number Block 0 of Super Block 745-2A is a replacement block. As another example, the physical blocks at block position BP3 include two bad blocks 747, e.g., the block within Plane 0 of array 702-1 and the block within Plane 1 of array 702-(K-1). As such, block number Block 2 of Super Block 745-2B and block number Block (N-1) of Super Block 745-2C are replacement blocks, e.g., the physical block located at block position BP12 within Plane 0 of array 702-1 and the physical block located at block position BP12 within Plane 1 of array 702-(K-1) are assigned to Super Blocks 745-2B and 745-2C, respectively, as replacement blocks for the respective bad blocks 747 at block position BP3.

As such, in the embodiment illustrated in FIG. 7, physical blocks are assigned to Super Blocks of the first type, e.g., 745-1A, 745-1B, and 745-1C, such that the physical blocks corresponding to a particular Super Block are each at the same respective block position 722. That is, each of the N/2 physical blocks of a particular Super Block shares the same block position 722. Physical blocks are assigned to Super Blocks of the second type, e.g., 745-2A, 745-2B, and 745-2C, such that at least one of the N/2 physical blocks of a particular Super Block of the second type is at a different block position 722. That is, the replacement physical block(s) assigned to the particular Super Block of the second type is at a different block position 722 than the non-defective blocks assigned to the particular Super Block of the second type.

In one or more embodiments, and as described in the embodiment of FIG. 5, a memory controller, e.g., memory controller 920 described in connection with FIG. 9, can include control circuitry configured to assign a particular number of physical blocks within each plane, e.g., Plane 0 and Plane 1, to be used to replace bad physical blocks 747 within that plane. For instance, in the embodiment illustrated in FIG. 7, the arrays 702-0 through 702-(K-1) include a portion 733 assigned for remapping. In this embodiment, each of the physical blocks at block positions BP12, BP13, and BP14, are assigned for replacing a respective bad block 747 and can be assigned to a particular Super Block of type 2, e.g., 745-2A, 745-2B, or 745-2C.

Assigning N/2 physical blocks to a Super Block, e.g., 745-1A, 745-1B, 745-1C, 745-2A, 745-2B, or 745-2C, in the manner illustrated in FIG. 7, can provide improved block management efficiency as compared to the previous approaches described in connection with FIGS. 3 and 4. For instance, in the embodiment illustrated in FIG. 7, a single LBA to PBA mapping entry in a LUT can be used to locate the physical blocks assigned to a Super Block of type 1, e.g., 745-1A, 745-1B, or 745-1C, since the physical blocks corresponding to a Super Block of type 1 share a common block position 722. Also, unlike in the example illustrated in FIG. 4, non-defective physical blocks that share a common block position with one or more bad blocks 747 can be assigned to a Super Block of type 2, e.g., 745-2A, 745-2B, or 745-2C, which can reduce the inefficiency associated with forced bad blocks.

As described further below in connection with FIGS. 8A-8C, a separate LUT can be used to map LBAs to PBAs for Super Blocks of type 2. The storage space used for storing the LUT used to map LBAs to PBAs for Super Blocks of type 2 can be small as compared to the LUT used to map LBAs to PBAs for Super Blocks of type 1. For instance, since there can be a relatively small number, e.g., 2-4%, of bad blocks 747, the number of Super Blocks of type 2 can be small as compared to the number of Super Blocks of type 1.

Figure 8A:
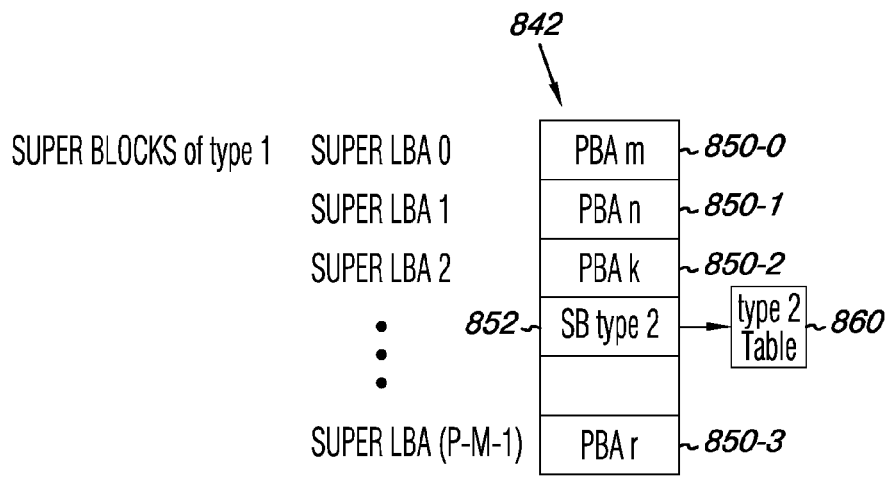
FIGS. 8A, 8B, and 8C illustrate tables having mapping information that can be used in accordance with one or more embodiments of the present disclosure.
Figure 8B:
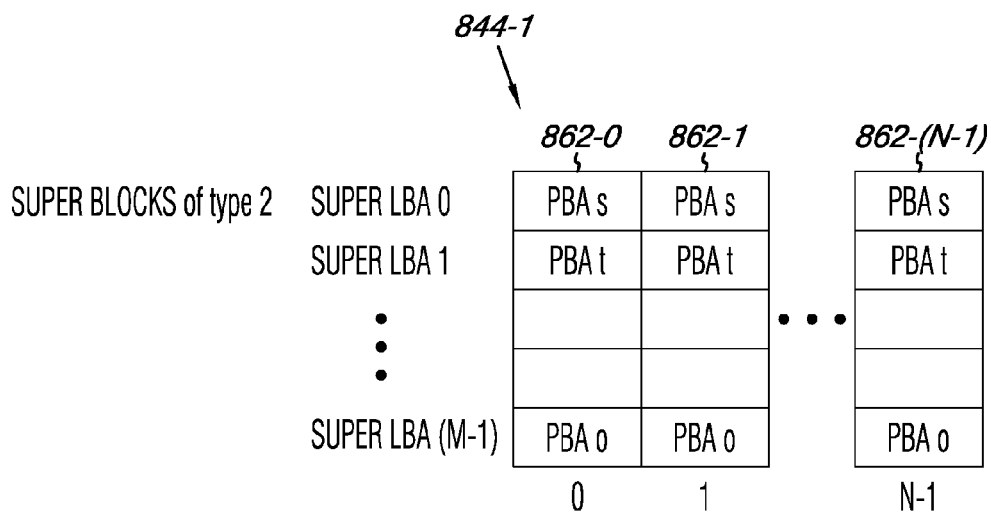
Figure 8C:
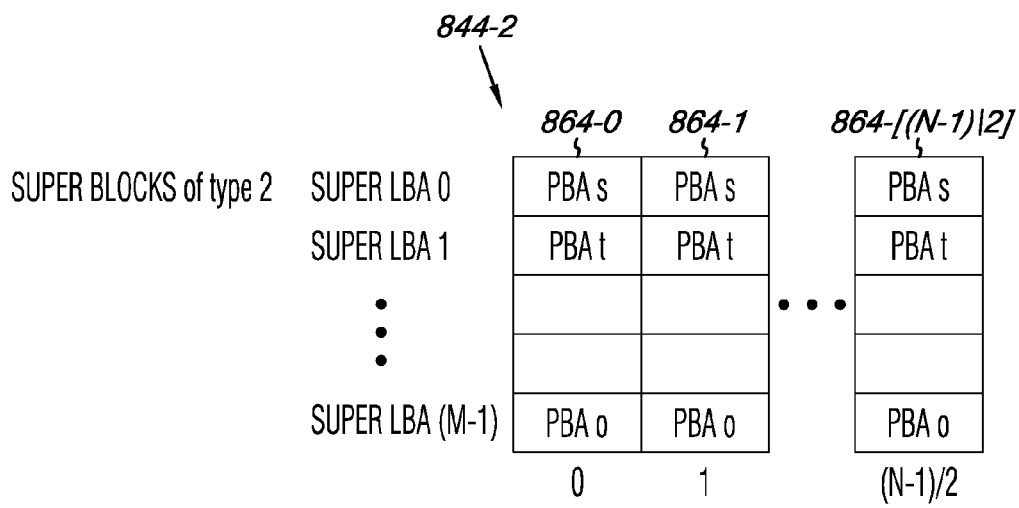

FIGS. 8A, 8B, and 8C illustrate tables having mapping information that can be used in accordance with one or more embodiments of the present disclosure. As one of ordinary skill in the art will appreciate, one or more LBAs can be received by a memory controller in association with a particular operation, e.g., program, read, erase, etc. A look up table (LUT) includes logical block address (LBA) to physical block address (PBA) mappings that can provide the physical locations of the physical blocks assigned to particular Super Blocks based on the received LBA.

FIG. 8A illustrates an example LUT 842 that includes LBA to PBA mappings corresponding to Super Blocks of different types, e.g., type 1 and type 2, as described herein in connection with FIGS. 5, 6, and 7. In the example illustrated in FIG. 8A, the indicator "P" represents the total number of physical blocks per plane within the multiple memory arrays associated with Super Blocks. The indicator "M" represents an uppermost number of defective blocks per plane within the multiple memory arrays. As described above, the number "M" can be provided by a manufacturer, for instance, as an expected maximum number of defective blocks per plane over the life of a particular memory array. Therefore, "P-M" represents the total number of usable physical blocks per plane and, as such, there can be "P-M" Super Blocks. Of the "P-M" Super Blocks, most will be Super Blocks of type 1, e.g., 545-1 or 645-1 described in connection with FIGS. 5 and 6, respectively, since there is a relatively small amount, e.g., 2%-4%, of bad blocks per plane.

As such, in the example illustrated in FIG. 8A, the table 842 includes "P-M" entries corresponding to a number of super LBAs (labeled SUPER LBA 0 through SUPER LBA (P-M-1) as shown). In this example, table 842 is a single entry table, e.g., each super LBA corresponds to a single entry. The entries 850-0, 850-1, 850-2, and 850-3 represent entries corresponding to Super Blocks of type 1. That is, since each of the physical blocks assigned to a Super Block of type 1 share a common block position, e.g., 522/622 shown in FIG. 5/6, a single entry can be used to determine the physical location of all of the physical blocks assigned to the particular Super Block of type 1.

In the example table 842, the entry 852 represents an entry corresponding to a Super Block of type 2, e.g., a Super Block having one or more physical blocks assigned thereto that have different block positions, as described in connection with FIGS. 5, 6, and 7. Since the physical blocks assigned to a type 2 Super Block can have various block positions across the multiple arrays, unlike the entries 850-1, 850-2, 850-2, and 850-3, the entry 852 does not include direct LBA to PBA mapping. Instead, the entry 852 includes an indication of a different table, e.g., table 860, which includes LBA to PBA mappings for Super Blocks of type 2.

As an example, consider a memory controller receiving a particular super LBA. A single entry table, e.g., 842, can first be searched based on the particular super LBA. If it is determined that the entry within table 842 that corresponds to the particular LBA is an entry corresponding to a PBA associated with a Super Block of type 2, e.g., 852, then a table such as table 860 can be searched to determine the appropriate mapping information indicating the physical locations of the physical blocks assigned to the particular type 2 Super Block. That is, the table 860 can include a PBA for each physical block in the collection of physical blocks corresponding to the particular type 2 Super Block. Examples of type 2 tables, such as table 860, which contain LBA to PBA mappings for Super Blocks of type 2, are illustrated in FIGS. 8B and 8C.

FIGS. 8B and 8C illustrate example LUTs 844-1 and 844-2 that each include LBA to PBA mappings corresponding to Super Blocks of type 2. Tables 844-1 and 844-2 can be tables such as table 860, which are searched in response to an indication within a table such as table 842 shown in FIG. 8A.

In the example illustrated in FIG. 8B, LUT 844-1 includes (M×N) entries, where "M" represents an uppermost number of expected defective blocks per plane within the multiple memory arrays, and "N" represents the number of physical blocks per Super Block. As an example, each of the entries 862-0, 862-1, . . . , 862-(N-1) includes LBA to PBA mapping information corresponding to a particular physical block assigned to a particular type 2 Super Block, e.g., 545-2A or 545-2B described in connection with the embodiment of FIG. 5.

In the example illustrated in FIG. 8C, LUT 844-2 includes [M×(N/2)] entries, where "M" represents an uppermost number of expected defective blocks per plane within the multiple memory arrays, and "N" represents the number of physical blocks per Super Block. As an example, each of the entries 864-0, 864-1, . . . , 864-[(N-1)/2] includes LBA to PBA mapping information corresponding to a particular pair of physical blocks (from Plane 0 and Plane 1 of a particular array) assigned to a particular type 2 Super Block, e.g., 645-2 described in connection with the embodiment of FIG. 6.

As one of ordinary skill in the art will appreciate, some memory systems are configured such that operations are performed on the physical blocks within both planes of a particular array at the same time. In such instances, a physical block that shares a common block position with a bad block within the same array, may be forced as unusable by the system. For example, as illustrated in the embodiment shown in FIG. 6, physical blocks which share a block position 622 with and are in the same array as a bad block 647 become forced bad blocks 649. As such the table 844-2 of FIG. 8C can have half as many entries as table 844-1 of FIG. 8B when the memory system, e.g., 900 shown in FIG. 9, is configured to perform operations on the physical blocks within both planes of the multiple memory arrays at once.

FIG. 9 is a functional block diagram of an electronic memory system 900 in accordance with one or more embodiments of the present disclosure. In one or more embodiments, the system 900 is a solid state drive (SSD), e.g., a flash SSD. That is, the embodiment of FIG. 9 can illustrate the components and architecture of one embodiment of a solid state drive 900. In the embodiment illustrated in FIG. 9, the system 900 includes a controller 920, a host interface 924, an array interface 926, and solid state memory unit 925.

In the embodiment illustrated in FIG. 9, the memory unit 925 includes a number of memory devices 930-0, 930-1, . . . , 930-D. As an example, the memory devices can be non-volatile memory devices such as flash memories, e.g., NAND flash or NOR flash devices, among others. The memory devices 930-0, 930-1, . . . , 930-D can be memory devices such as memory devices 230-0, 230-1, 230-2, and 230-3 described in connection with FIG. 2. In one or more embodiments, and as illustrated in FIG. 9, each of the memory devices 930-0, 930-1, . . . , 930-D includes a number of memory arrays 902-0, 902-1, 902-3, . . . , 902-(K-1). The memory arrays 902-0, 902-1, 902-3, . . . , 902-(K-1) can be arrays such as the memory arrays described in connection with FIGS. 5, 6, and 7. For instance, each of the memory arrays 902-0, 902-1, 902-3, . . . , 902-(K-1) can include multiple physical blocks of memory cells. In one or more embodiments, each of the memory arrays 902-0, 902-1, 902-3, . . . , 902-(K-1) can represent a single die, and each of the memory devices 930-0, 930-1, . . . , 930-D can represent a memory chip having multiple dies per chip.

In one or more embodiments, the memory unit 925 can be organized into multiple Groups of planes across the memory arrays with each Group being a collection of at least two planes from different memory devices. As described above in connection with FIG. 2, the Groups can have a number of Super Blocks associated therewith, with the Super Blocks being a collection of a physical block from each of the at least two planes of the Group. In various embodiments, the at least two planes of the Group can be located on at least two different memory arrays.

As illustrated in FIG. 9, the memory unit 925 can be coupled to the controller 920 via an array interface 926. The array interface 926 can be used to communicate information between the memory unit 925 and the controller 920. The controller 920 can be coupled to a memory access device, e.g., a processor of a host device (not shown), via host interface 924. A host device can include a computing device such as a personal computer (PC), a laptop computer, a digital camera, or a cellular telephone, among various other computing devices. As an example, when the memory unit 925 is used for data storage in a computing device, as illustrated in FIG. 9, the host interface 924 can be a serial advanced technology attachment (SATA), among others, e.g., the controller 920 can be a SATA controller or a USB controller, among others. That is, embodiments are not limited to a particular type of controller 920 and/or host interface 924.

In one or more embodiments, and as illustrated in FIG. 9, the controller 920 includes control circuitry 922. The control circuitry 922 can include a processor 923, a space manager 927, memory 929, e.g., a RAM, among other control circuitry (not shown) for operation of memory system 900. In one or more embodiments, the controller 920 is used to write data to and read data from the memory unit 925.

In one or more embodiments, the controller 920 can receive logical block addresses (LBAs) 931 from a host device via the host interface 924. The control circuitry 922 can be configured to search one or more look up tables, such as tables 842, 844-1, and 844-2, to determine the physical location of physical blocks assigned to particular Super Blocks.

In various embodiments, and as described above, the control circuitry 922 can be configured to selectively assign physical blocks to either Super Blocks of a first type or Super Blocks of a second type, with the Super Blocks being collections of physical blocks from each of at least two different planes. In various embodiments, the at least two different planes can be from different memory arrays. The control circuitry 922 can be configured to assign physical blocks to particular Super Blocks as described, for example, in FIGS. 5, 6, and 7.

CONCLUSION

The present disclosure includes methods and devices for memory block management in a memory system. Embodiments of the present disclosure can improve the efficiency of memory block management as compared to previous approaches. One or more embodiments of the present disclosure include one or more memory devices having at least two planes of physical blocks organized into super blocks, with each super block including a physical block from each of the at least two planes. One or more embodiments include determining defective physical blocks within the planes. If none of the physical blocks at a particular block position are determined to be defective, one or more embodiments include assigning the physical blocks at the particular block position to a super block, and if one or more of the physical blocks at a particular block position are determined to be defective, one or more embodiments include: assigning the physical blocks at the particular block position that were not determined to be defective to a super block; and assigning a respective replacement physical block to the super block for each of the one or more physical blocks at the particular block position that were determined to be defective. In one or more embodiments, the respective replacement physical block is selected from a number of physical blocks within a respective one of the planes that includes the respective physical block that was determined to be defective.

One or more embodiments of the present disclosure include determining defective physical blocks within a memory unit having multiple Groups of planes associated therewith, each Group including at least two planes of physical blocks organized into Super Blocks, with each Super Block including a physical block from each of the at least two planes. Embodiments can include assigning collections of blocks from each of the at least two planes of a respective Group to respective Super Blocks. A Super Block can include: a collection of all non-defective blocks having the same particular position number within each of the at least two planes of a respective Group; and a replacement block for each defective block having the same particular position number as the non-defective blocks. The replacement block can be selected from a group of blocks within each plane assigned to be used to replace defective blocks within the respective plane.

Although specific embodiments have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure.

It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and methods are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim.

Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A memory controller, comprising:
control circuitry coupled to one or more memory devices having at least two planes of physical blocks organized into super blocks, with each super block including a physical block from each of the at least two planes, and wherein the control circuitry is configured to:
determine defective physical blocks within the planes;
if none of the physical blocks at a particular block position are determined to be defective, assign the physical blocks at the particular block position to a super block; and
if one or more of the physical blocks at a particular block position are determined to be defective:
assign the physical blocks at the particular block position that were not determined to be defective to a super block; and
assign a respective replacement physical block to the super block for each of the one or more physical blocks at the particular block position that were determined to be defective; wherein the respective replacement physical block is selected from a number of physical blocks within a respective one of the planes that includes a respective physical block that was determined to be defective.

2. The memory controller of claim 1, wherein:
at least one of the physical blocks at the particular block position that were determined to be defective is a grown defective physical block; and
the control circuitry is configured to dynamically assign a respective replacement physical block to a super block for each of the at least one physical blocks at the particular block position that were determined to be a grown defective physical block.

3. The memory controller of claim 1, wherein the control circuitry is configured to determine a number of physical blocks.

4. The memory controller of claim 3, wherein the number of physical blocks is determined based, at least partially, on an uppermost expected number of defective blocks per plane.

5. The memory controller of claim 3, wherein the number of physical blocks does not exceed an uppermost expected number of defective blocks per plane.

6. The memory controller of claim 1, wherein the control circuitry is configured to map a physical block determined to be defective to a replacement block at a different block position than the physical block determined to be defective.

7. The memory controller of claim 1, wherein the control circuitry is configured to treat an otherwise non-defective physical block as a defective block for each physical block within a particular same array and at the same particular block position as a physical block determined to be defective.

8. A memory controller, comprising:
control circuitry coupled to one or more memory devices having at least two planes of physical blocks organized into super blocks, with each super block including a physical block from each of the at least two planes, and wherein the control circuitry is configured to:
selectively assign at least some of the physical blocks to one of a super block of a first type and a super block of a second type;
wherein the first type of super block includes only physical blocks at a respective same block position across the at least two planes; and
wherein the second type of super block includes physical blocks, at a respective same block position across the at least two planes, that have not been determined to be defective, and at least one physical block, at a different block position, that replaces at least one physical block, at a particular block position, determined to be defective.

9. The memory controller of claim 8, wherein the control circuitry is configured to access a table that includes:
a number of entries each having mapping information corresponding to a respective super block of the first type; and
a number of entries each having an indication of a different table having mapping information corresponding to a respective super block of the second type.

10. The memory controller of claim 9, wherein the control circuitry is configured to, based on a particular logical super block address, search the different table to determine a physical super block address of a particular super block of the second type.

11. The memory controller of claim 10, wherein the different table includes a physical block address for each physical block assigned to the particular super block of the second type.

12. The memory controller of claim 10, wherein the memory unit includes multiple flash memory devices with each flash memory device including at least one memory array, and wherein the at least two planes are from at least two different memory arrays and are organized into one of a number of groups.

13. The memory controller of claim 8, wherein the block positions indicate physical locations of physical blocks within their respective planes.

14. A memory controller, comprising:
control circuitry coupled to one or more memory devices having at least two planes of physical blocks organized into super blocks, with each super block including a physical block from each of the at least two planes, and wherein the control circuitry is configured to:
selectively assign at least some of the physical blocks to one of a super block of a first type and a super block of a second type, each type of super block including no more than one physical block from a particular plane;
wherein the first type of super block includes only physical blocks at a particular block position across the at least two planes; and
determine if a physical block within the at least two planes of is defective; and
wherein a physical block at the block position of a physical block determined to be defective, and that has not been determined to be defective, is assigned to a super block of the second type.

15. The memory controller of claim 14, wherein the control circuitry is configured to prevent a block, at the block position of and in a same array as a block determined to be defective, that has not been determined to be defective, from being assigned to a super block of the second type.

16. The memory controller of claim 14, wherein one or more super blocks of the second type includes at least two blocks at a same block position.

17. The memory controller of claim 14, wherein one or more super blocks of the second type includes at least three blocks at a same block position.

18. The memory controller of claim 14, wherein the one or more memory devices form a portion of a flash solid state drive, 19. The memory controller of claim 14, wherein the physical blocks corresponding to a super block are substantially simultaneously erasable.

20. The memory controller of claim 14, wherein the first and second type of super blocks each include a same number of physical blocks.

21. A memory controller, comprising:
control circuitry coupled to one or more memory devices having at least two planes of physical blocks organized into super blocks, with each super block including a physical block from each of the at least two planes, and wherein the control circuitry is configured to:
determine if a physical block within the at least two planes is defective;
selectively assign at least some of the physical blocks to a respective one of the super blocks, wherein each of the super blocks has no more than one physical block from a particular plane; and
wherein at least one of the super blocks includes:
physical blocks at a particular block position across the at least two planes that have not been determined to be defective; and
a replacement block for a physical block, at the particular block position, that has been determined to be defective, the replacement physical block selected from an assigned group of physical blocks within a same plane as the physical block determined to be defective.

22. A method for block management in a memory system, the method comprising:
determining defective physical blocks within a memory unit having at least two planes of physical blocks organized into super blocks, with each super block including a physical block from each of the at least two planes; and
assigning a physical block from each of the at least two planes to a respective one of the super blocks;
wherein each of the super blocks includes:
physical blocks, at a respective same block position of the at least two planes, that have not been determined to be defective; and
if a physical block at the respective same block position is determined to be defective, a replacement block for the physical block determined to be defective, the replacement physical block selected from physical blocks within a same plane as the physical block determined to be defective.

23. The method of claim 22, including assigning a number of physical blocks within each plane to be used to replace physical blocks that have been determined to be defective within each plane.

24. The method of claim 22, including mapping the physical block determined to be defective to the replacement block.

25. A method for block management in a memory system, the method comprising:
assigning physical blocks to a first type of super block associated with a memory unit, the memory unit having at least two different planes of physical blocks, with each super block including a physical block from each of the at least two different planes;
assigning physical blocks to a second type of super block associated with the memory unit;
wherein each super block of the first type includes only physical blocks at a respective block position across the at least two different planes; and
wherein each super block of the second type includes a physical block at a respective block position across the at least two different planes and a physical block at a different block position, the physical block at the different block position replacing a physical block, at the respective block position, that has been determined to be defective.

26. The method of claim 25, including preventing physical blocks at a same block position and in a same array as a block determined to be defective from being assigned to a super block of the second type.

27. The method of claim 25, including searching a table that includes:
a number of entries each having mapping information corresponding to a respective super block of the first type; and
a number of entries each having an indication of a different table having mapping information corresponding to a respective super block of the second type.

28. The method of claim 27, including searching the different table to determine a physical super block address of a particular super block of the second type based on a particular logical super block address.

29. A memory controller, comprising:
control circuitry coupled to one or more memory devices having at least two planes of physical blocks organized into super blocks, with each super block including a physical block from each of the at least two planes, and wherein the control circuitry is configured to:
determine defective physical blocks within the planes, the defective physical blocks including original defective blocks as well as grown defective blocks;
if none of a plurality of physical blocks at a particular block position are determined to be defective, assign the plurality of physical blocks at the particular block position to a super block; and
if one or more of the plurality of physical blocks at the particular block position number are determined to be defective:
assign the one or more physical blocks at the particular block position that were not determined to be defective to a super block; and
assign a respective replacement physical block to a super block for each of the one or more of the plurality of physical blocks at the particular block position that were determined to be defective; wherein the respective replacement physical block is selected from an assigned number of physical blocks within a respective one of the planes that includes a respective physical block that was determined to be defective.

30. The memory controller of claim 29, wherein the control circuitry is configured to:
if one or more of the physical blocks currently assigned to a particular super block becomes a grown defective block,
assign a replacement block for the grown defective block from the assigned number of physical blocks within the respective one of the planes.

* * * * *

UNITED STATES PATENT AND TRADEMARK OFFICE
CERTIFICATE OF CORRECTION

PATENT NO. : 8,095,765 B2
APPLICATION NO. : 12/397396
DATED : January 10, 2012
INVENTOR(S) : Mehdi Asnaashari et al.

It is certified that error appears in the above-identified patent and that said Letters Patent is hereby corrected as shown below:

In column 23, line 67, in Claim 14, delete "of is" and insert -- is --, therefor.

In column 24, line 19, in Claim 18, delete "drive," and insert -- drive. --, therefor.

Signed and Sealed this
Thirteenth Day of March, 2012

David J. Kappos
*Director of the United States Patent and Trademark Office*